US007763095B2

(12) United States Patent
Buonassisi et al.

(10) Patent No.: US 7,763,095 B2
(45) Date of Patent: Jul. 27, 2010

(54) INTERNAL GETTERING BY METAL ALLOY CLUSTERS

(75) Inventors: Anthony Buonassisi, San Diego, CA (US); Matthias Heuer, Berkeley, CA (US); Andrei A. Istratov, Albany, CA (US); Matthew D. Pickett, Berkeley, CA (US); Mathew A. Marcus, Berkeley, CA (US); Eicke R. Weber, Piedmont, CA (US)

(73) Assignee: The Regents of the University of California, Oakland, CA (US)

( * ) Notice: Subject to any disclaimer, the term of this patent is extended or adjusted under 35 U.S.C. 154(b) by 598 days.

(21) Appl. No.: 11/447,223

(22) Filed: Jun. 5, 2006

(65) Prior Publication Data

US 2006/0289091 A1   Dec. 28, 2006

Related U.S. Application Data

(60) Provisional application No. 60/688,041, filed on Jun. 7, 2005.

(51) Int. Cl.
*C22B 43/00* (2006.01)
*C22C 19/03* (2006.01)
*H01L 21/26* (2006.01)

(52) U.S. Cl. ............... 75/406; 148/426; 148/185; 438/510

(58) Field of Classification Search ............... 148/426; 75/406; 438/510
See application file for complete search history.

(56) References Cited

U.S. PATENT DOCUMENTS

| 5,627,081 | A | 5/1997 | Tsuo et al. |
| 6,201,261 | B1 | 3/2001 | Sopori |
| 6,695,955 | B2* | 2/2004 | Hwang et al. .......... 204/192.12 |
| 6,852,371 | B2 | 2/2005 | Sopori |

FOREIGN PATENT DOCUMENTS

JP        07335656 A  * 12/1995

OTHER PUBLICATIONS

Tonio Buonassisi et al, "Synchrontron-Based Investigations into Metallic Impurity Distribution and Defect Engineering in Multicrystalline Silicon Via Thermal Treatments", Photovoltaic Specialists Conference, 2005, Conference Record of the Thirty First IEEE, Lake Buena Vista, FL, USA Jan. 3-7, 2005, XP008069856, pp. 1027-1030.

(Continued)

*Primary Examiner*—Roy King
*Assistant Examiner*—Jie Yang
(74) *Attorney, Agent, or Firm*—Michaelson & Associates; Peter L. Michaelson; George Wolken, Jr.

(57) ABSTRACT

The present invention relates to the internal gettering of impurities in semiconductors by metal alloy clusters. In particular, intermetallic clusters are formed within silicon, such clusters containing two or more transition metal species. Such clusters have melting temperatures below that of the host material and are shown to be particularly effective in gettering impurities within the silicon and collecting them into isolated, less harmful locations. Novel compositions for some of the metal alloy clusters are also described.

26 Claims, 20 Drawing Sheets

OTHER PUBLICATIONS

Tonio Buonassisi et al, "Synchrotron-based investigations of the nature and impact of iron contamination in multicrystalline silicone solar cells", Journal of Applied Physics, vol. 97, No. 7, Mar. 21, 2005, pp. 74901-1 through 749801-11.

A.A. Istratov et al, "Electrical properties and recombination activity of copper, nickel and cobalt in silicon", Appl. Phys. A., vol. 66, Feb. 1998, pp. 123-136.

T. Buonassisi et al, "Quantifying the effect of metal rich precipitates on minority carrier diffusion length in multicrystalline silicon using synchrotron based spectrally resolved x ray beam induced current", Applied Physics Letters, vol. 87, No. 044101, (2005), 3 pp.

T. Buonassisi et al, "Engineering metal impurity nanodefects for low cost solar cells", pp. 1-4.

T. Buonassisi et al, "Chemical Natures and Distributions of Metal Impurities in Multicrystalline Silicon Materials", Progress in Photovoltaics: Research and Applications, 19 pp.

J-G. Lee and S.R. Morrison, "Copper passivation of dislocations in silicon", Journal of Applied Physics, vol. 64, No. 12, Dec. 15, 1988, pp. 6679-6683.

S.K. Estreicher, "Copper, lithium, and hydrogen passivation of boron in c-Si", Rapid Communications, vol. 41, No. 8, Mar. 15, 1990, pp. 5447-5450.

R. Jonczyk et al, "Effect of High Levels of Transition Metals on SiliconfilmTM Sheet Silicon Material", 3 pp.

H. Hieslmair et al, "Aluminum Backside Segregation Gettering", IEEE, 25th PVSC, May 13-17, 1996, Washington, D.C., pp. 441-444.

A. Goetzberger and W. Shockley, "Metal Precipitates in Silicon p-n Junctions", Journal of Applied Physics, vol. 31, No. 10, Oct. 1960, pp. 1821-1824.

S. Pizzini et al, "On the Effect of Impurities on the Photovoltaic Behavior of Solar Grade Silicon", Journal of Electrochem. Soc.:Solid-State Science and Technology, vol. 133, No. 11, Nov. 1986, pp. 2363-2373.

S.M. Meyers et al, "Mechanisms of transition-metal gettering in silicon", Journal of Applied Physics, vol. 88, No. 7, Oct. 1, 2000, pp. 3795-3819.

T.F. Ciszek and T.H. Wang, "Silicon defect and impurity studies using float-zone crystal growth as a tool", Journal of Crystal Growth, 2002, pp. 1685-1691.

A.A. Istratove et al, "Metal content of multicrystalline silicon for solar cells and its impact on minority carrier diffusion length", Journal of Applied Physics, vol. 94, No. 10, Nov. 15, 2003, pp. 6552-6559.

X. Yan and Y.A. Chang, "A thermodynamic analysis of the Cu-Si system", Journal of Alloys and Compounds, 2000, pp. 221-229.

T. Buonassisi et al, "Analysis of copper-rich precipitates in silicon: Chemical state, gettering, and impact on multicrystalline silicon solar cell material", Journal of Applied Physics, vol. 97, 2005, 9 pp.

T. Tokunaga et al, "Thermodynamic assessment of the Ni-Si system by incorporating ab initio energetic calculations into the CALPHAD approach", Computer Coupling of Phase Diagrams and Thermochemistry, vol. 27, 2003, pp. 161-168.

E.R. Weber, "Transition Metals in Silicon", Applied Physics A Solids and Surfaces, vol. 30, 1983, pp. 1-22.

* cited by examiner

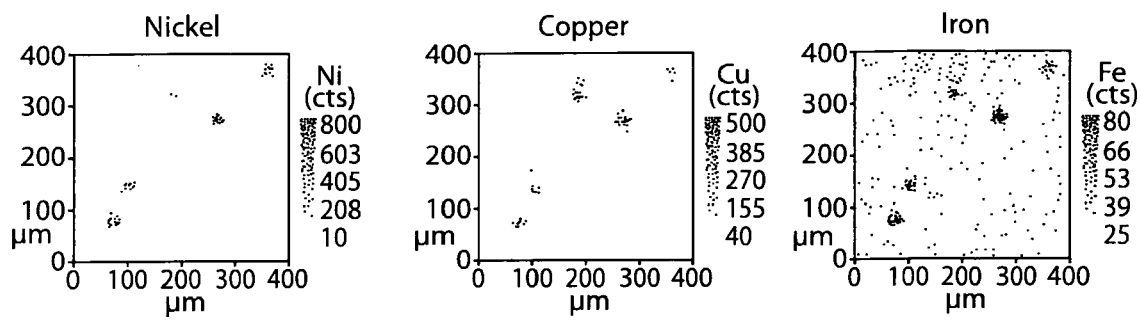
FIG. 7 (A-1)
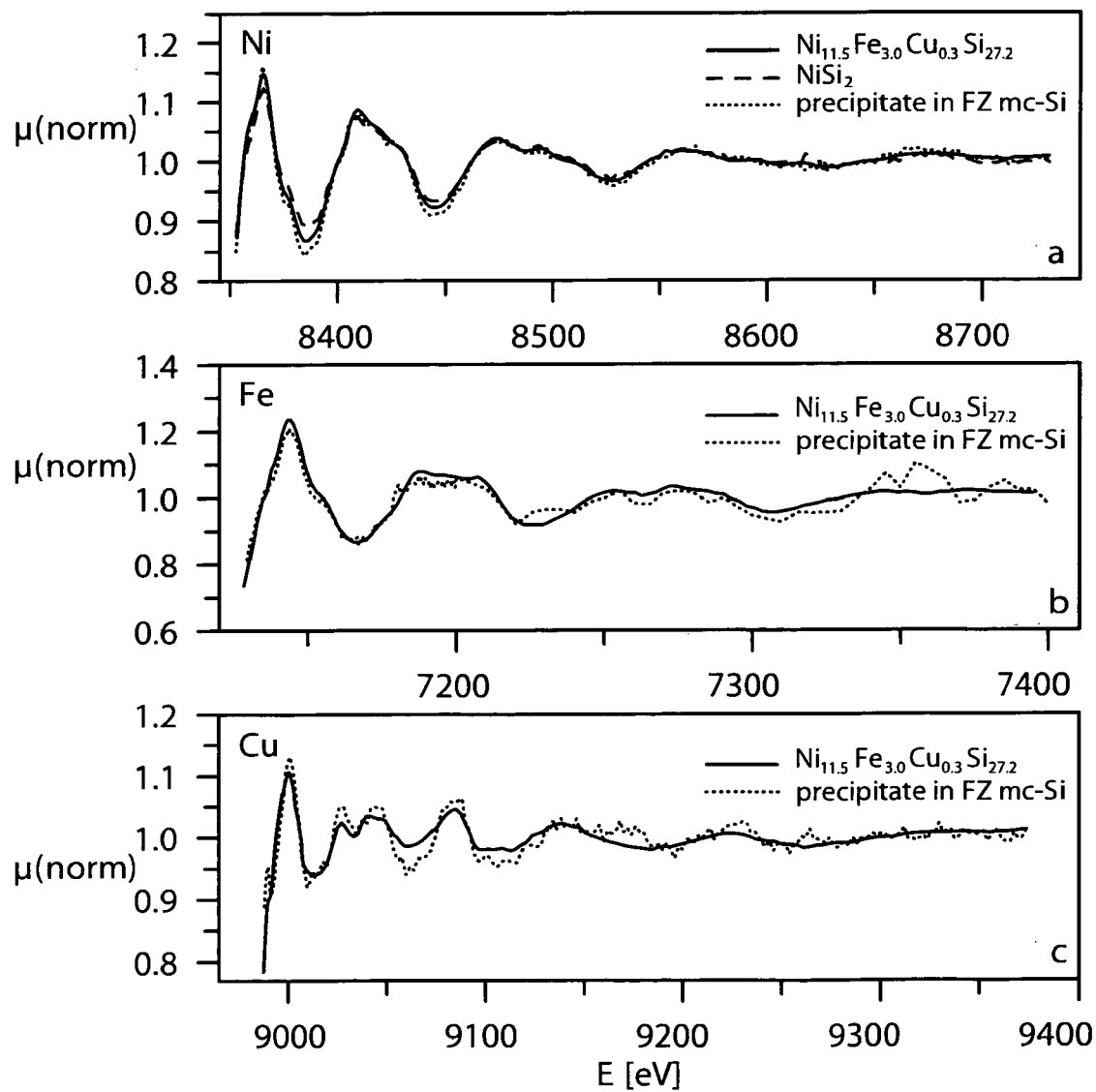
FIG. 8 (A-2)

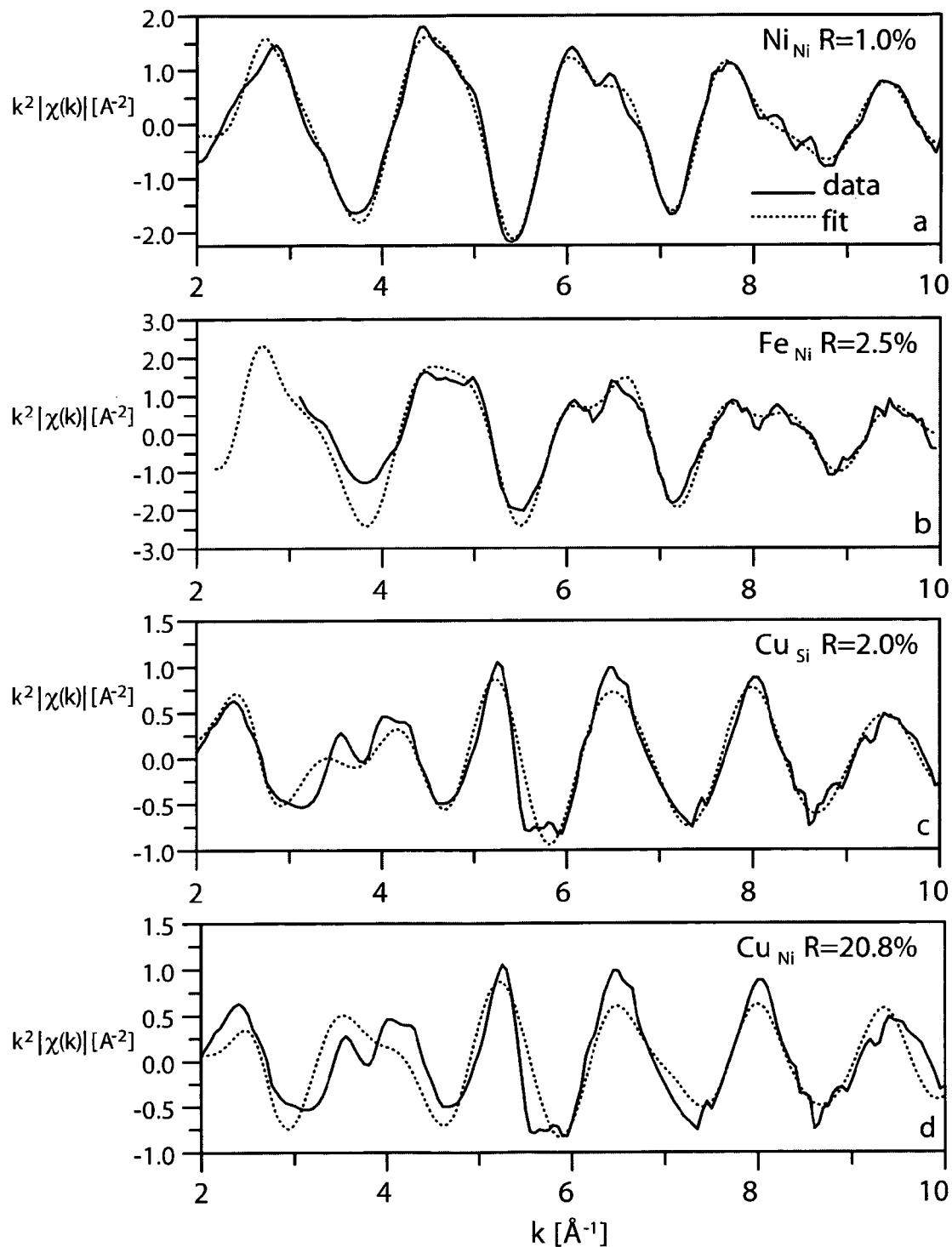
FIG. 9 (A-3)

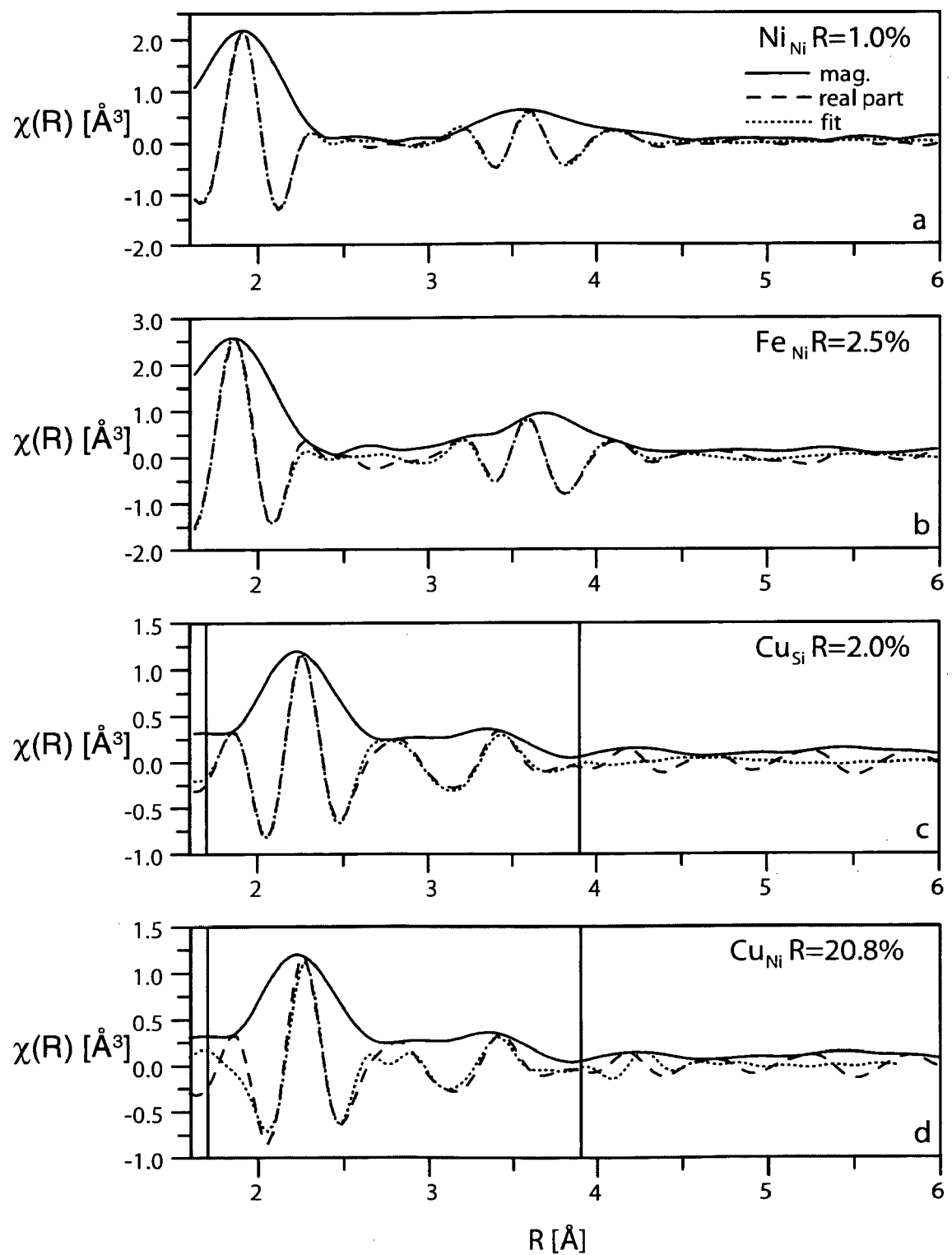
FIG. 10 (A-4)

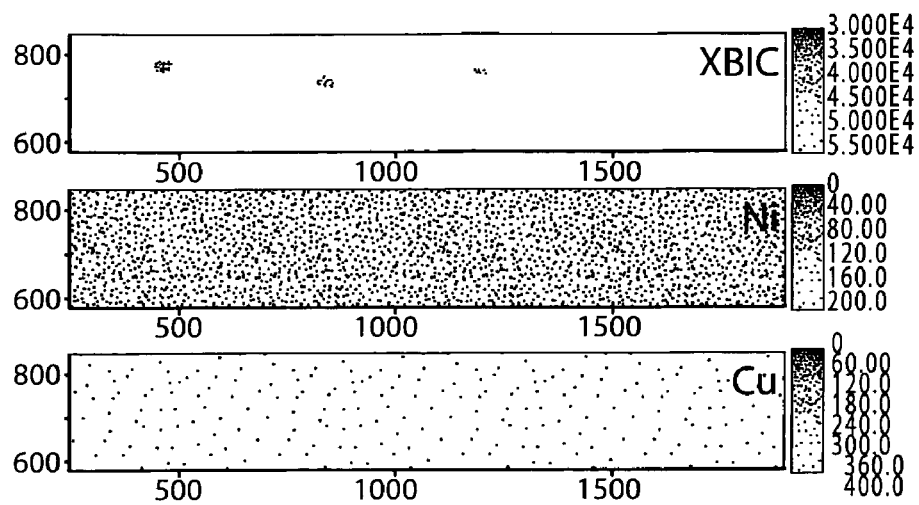
FIG. 11 (b-1)
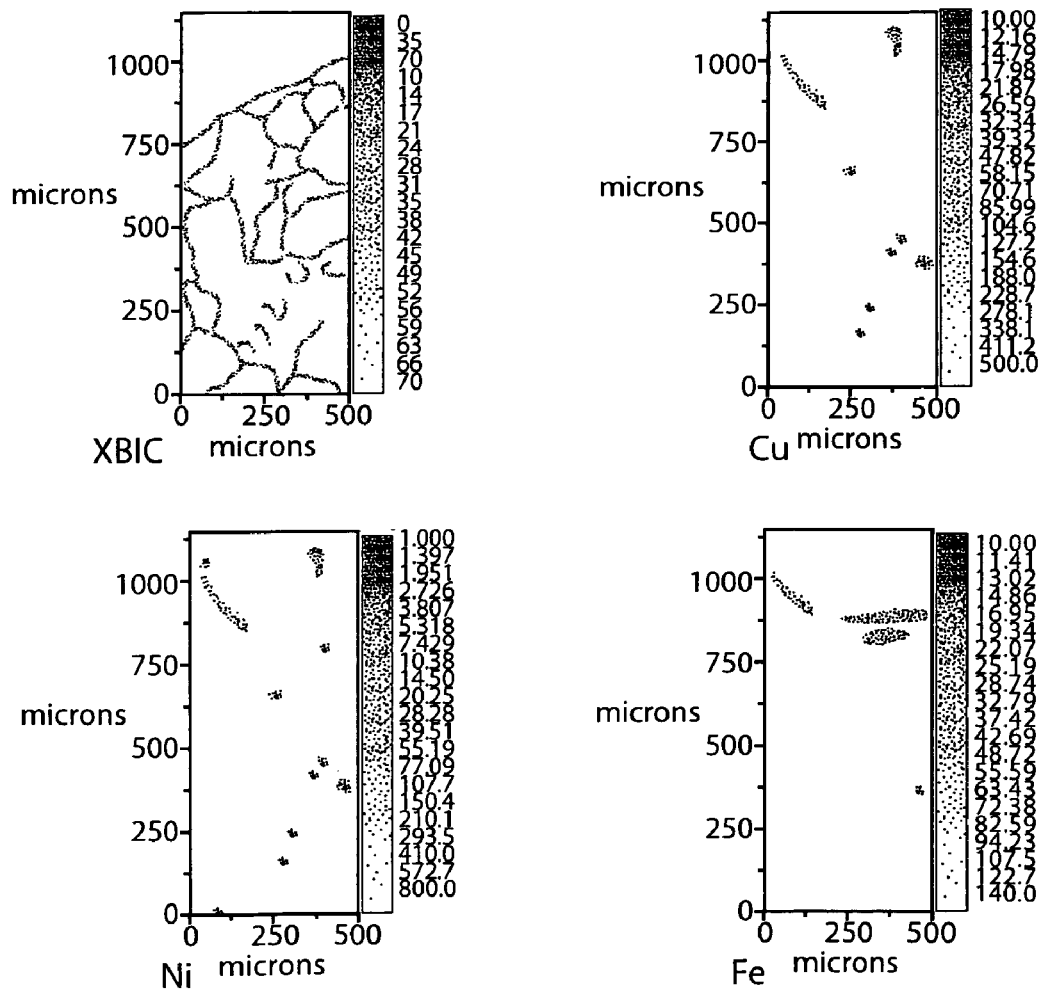
FIG. 12 (b-2)

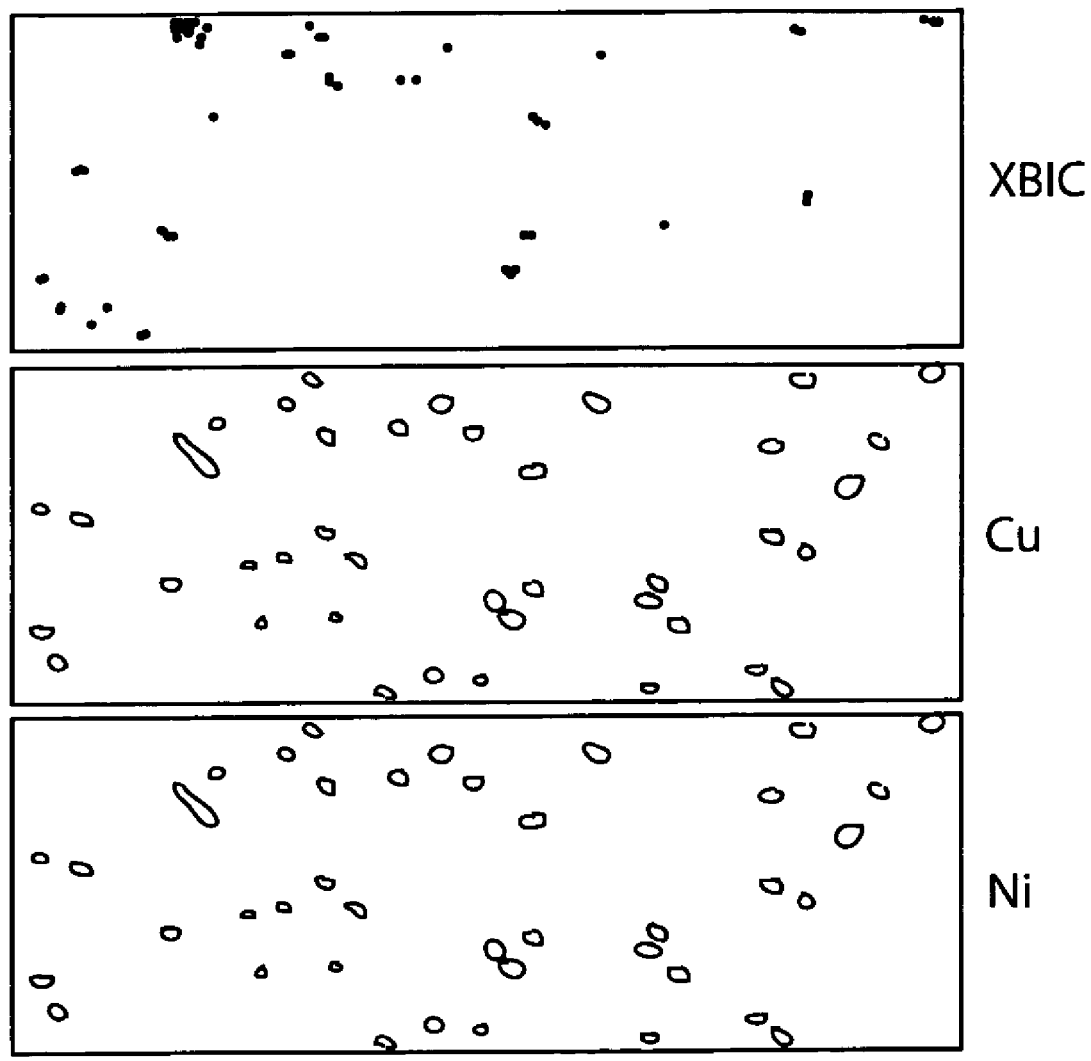
FIG. 13 (b-3)

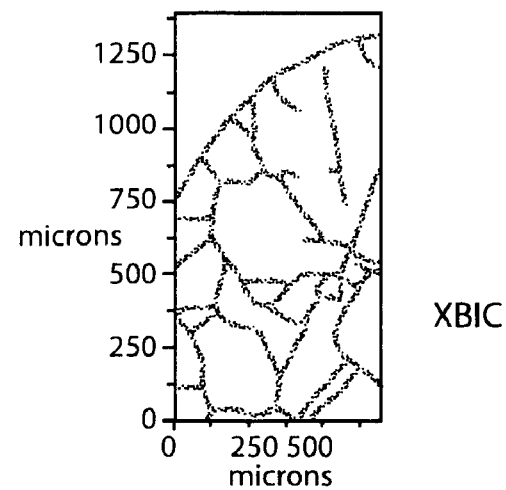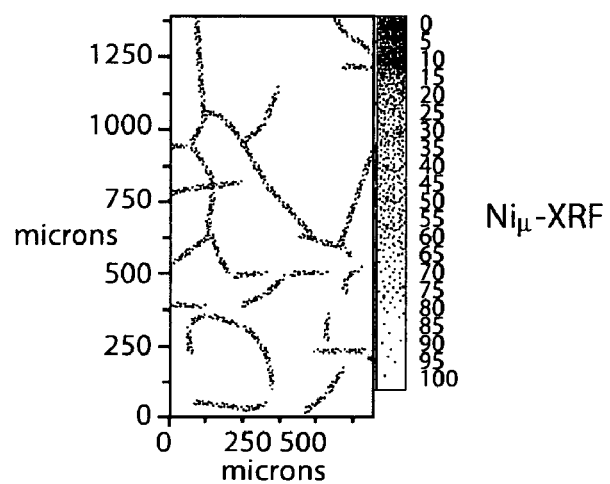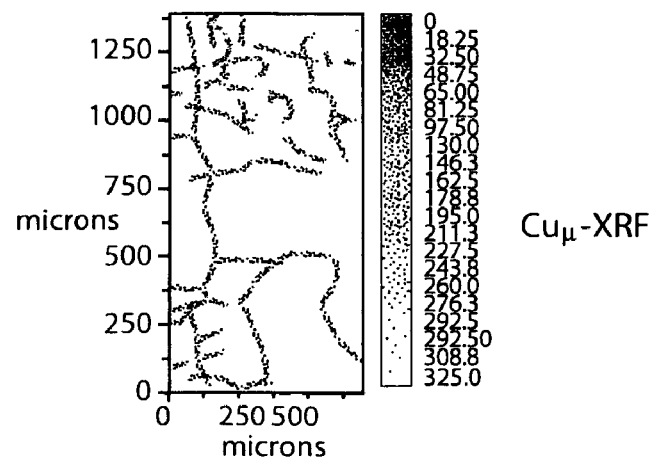
FIG. 14 (b-4)

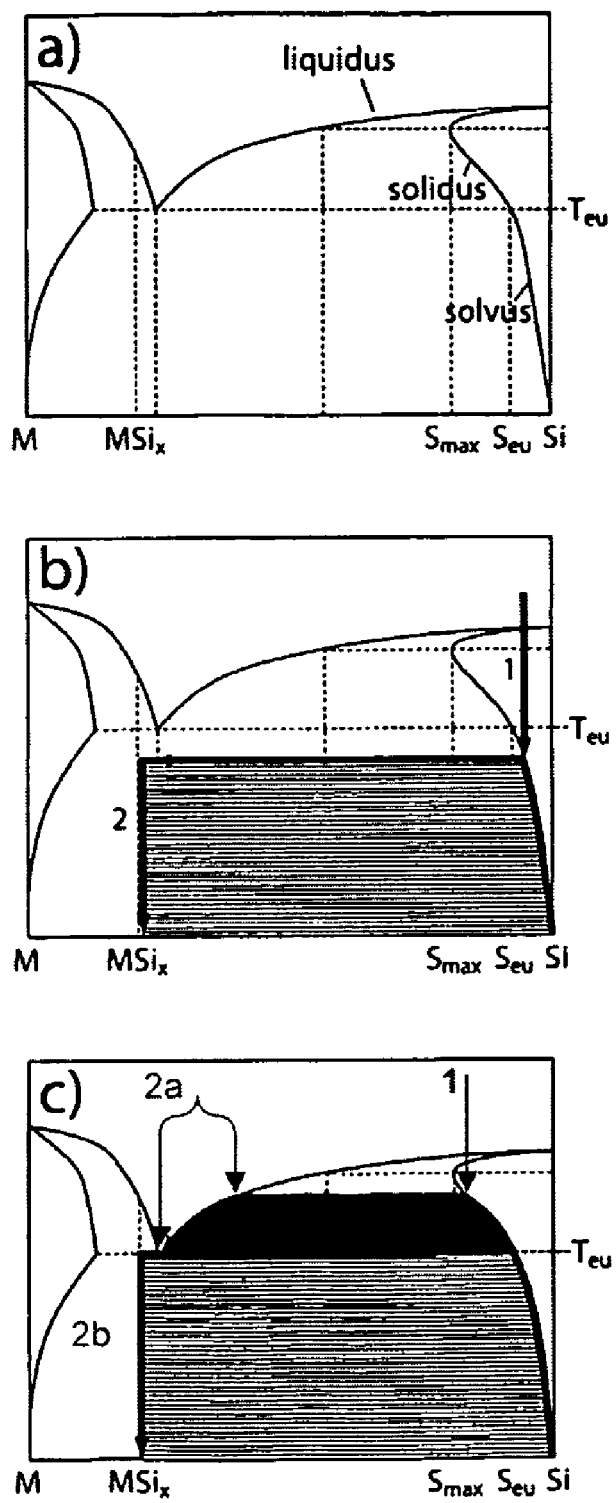
FIG. 15 (c-1)

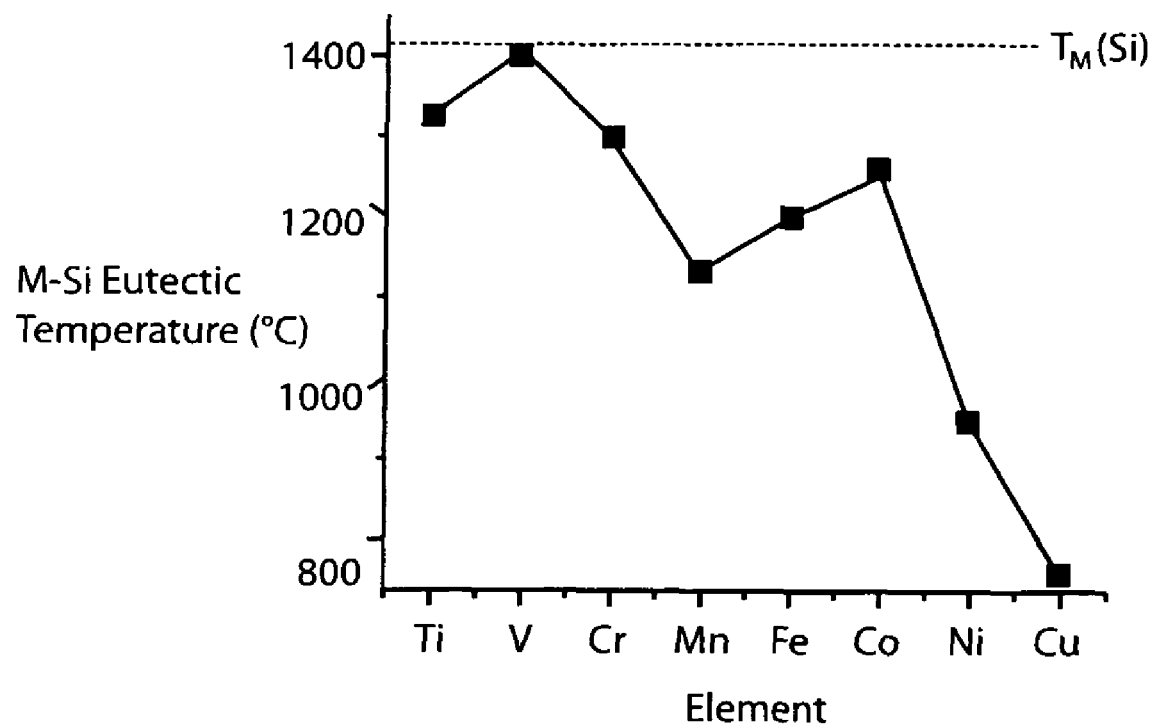
FIG. 16 (c-2)

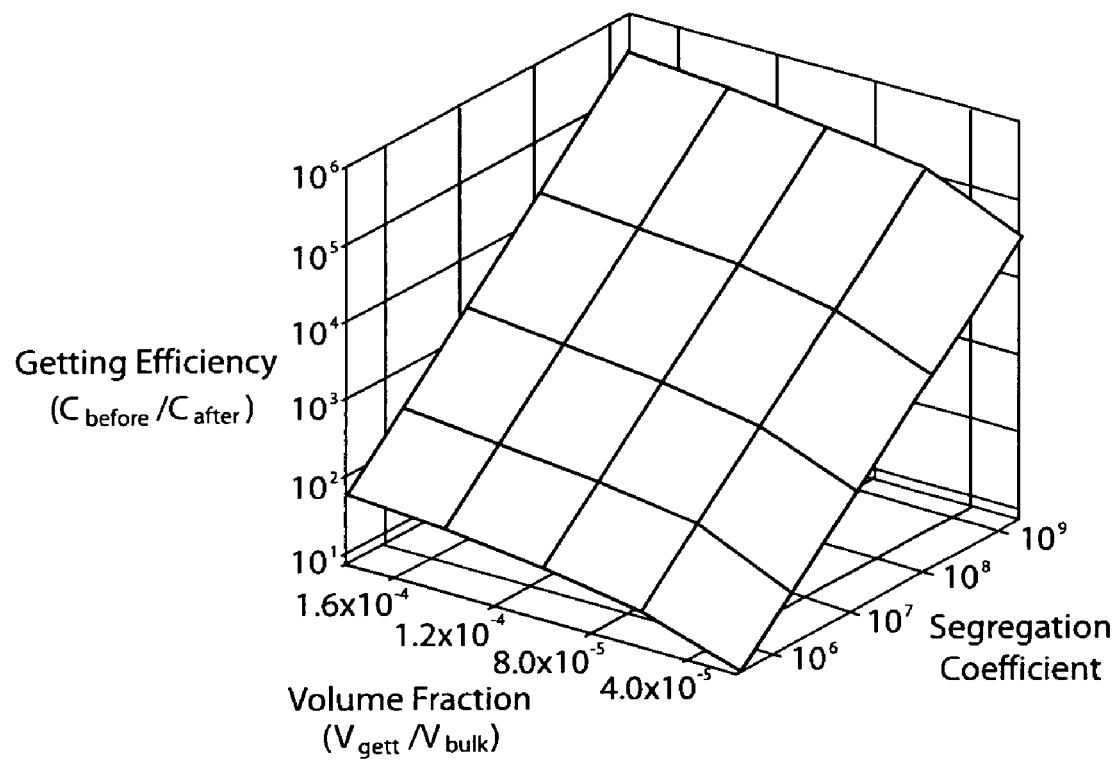
FIG. 17 (c-3)

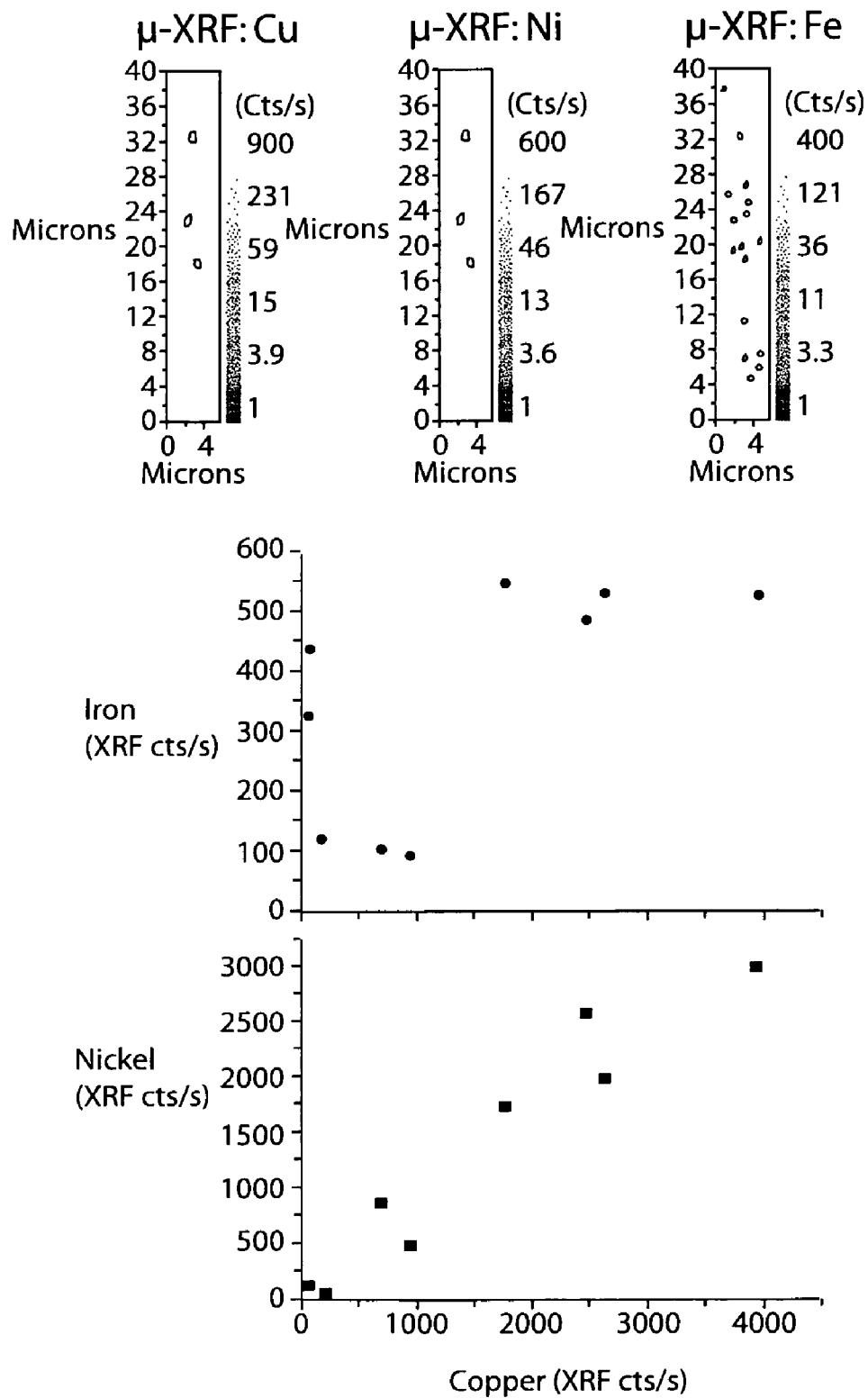
FIG. 18 (c-4)

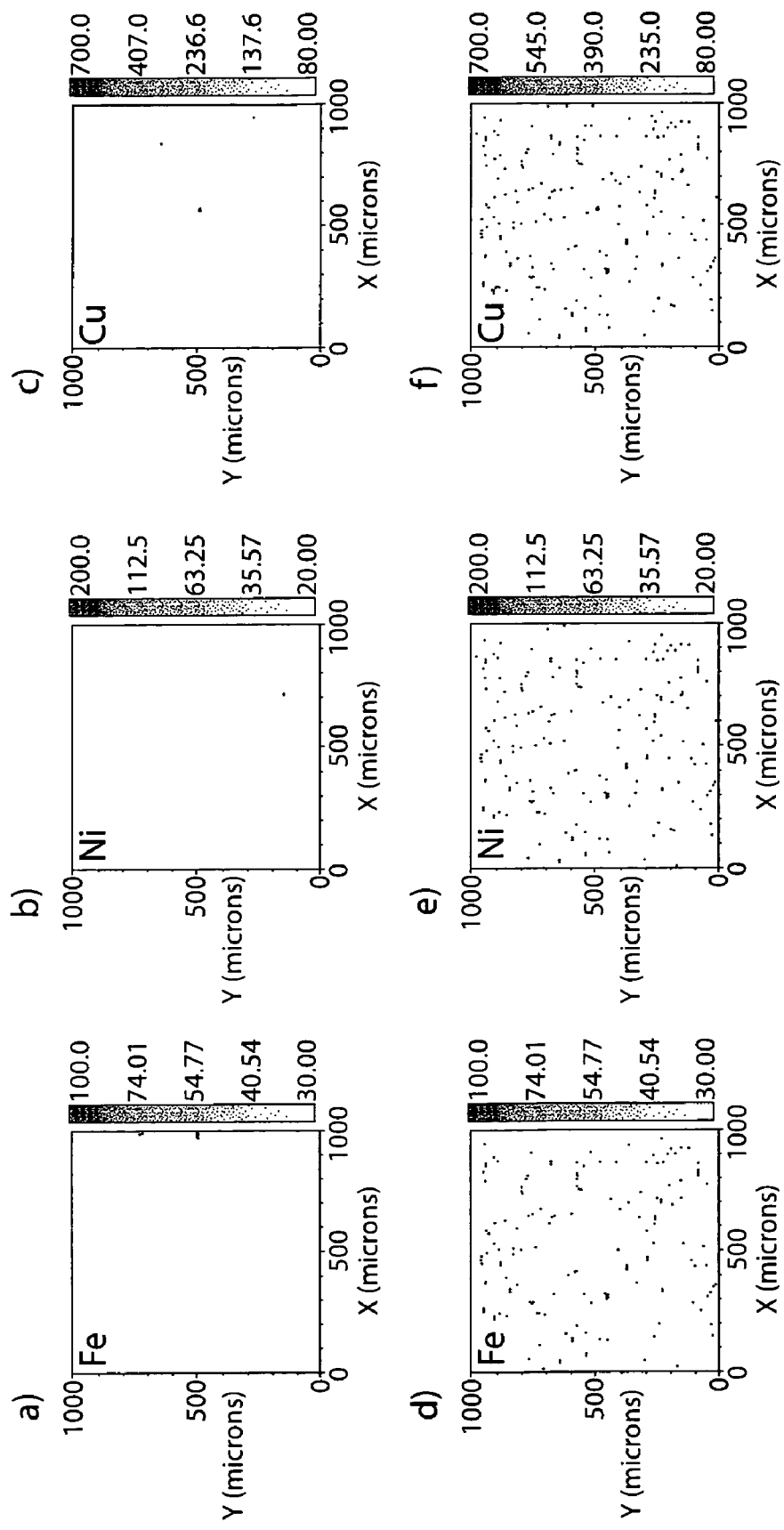
FIG. 19 (c-5)

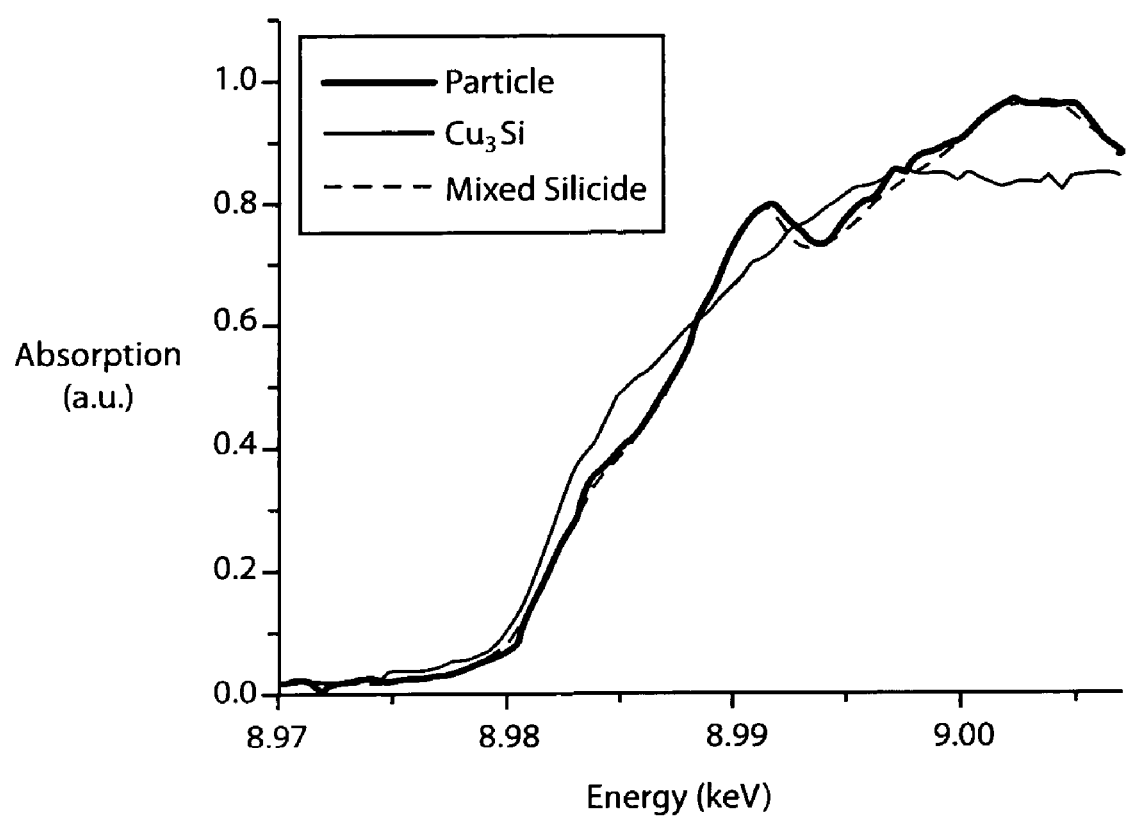
FIG. 20 (c-6)

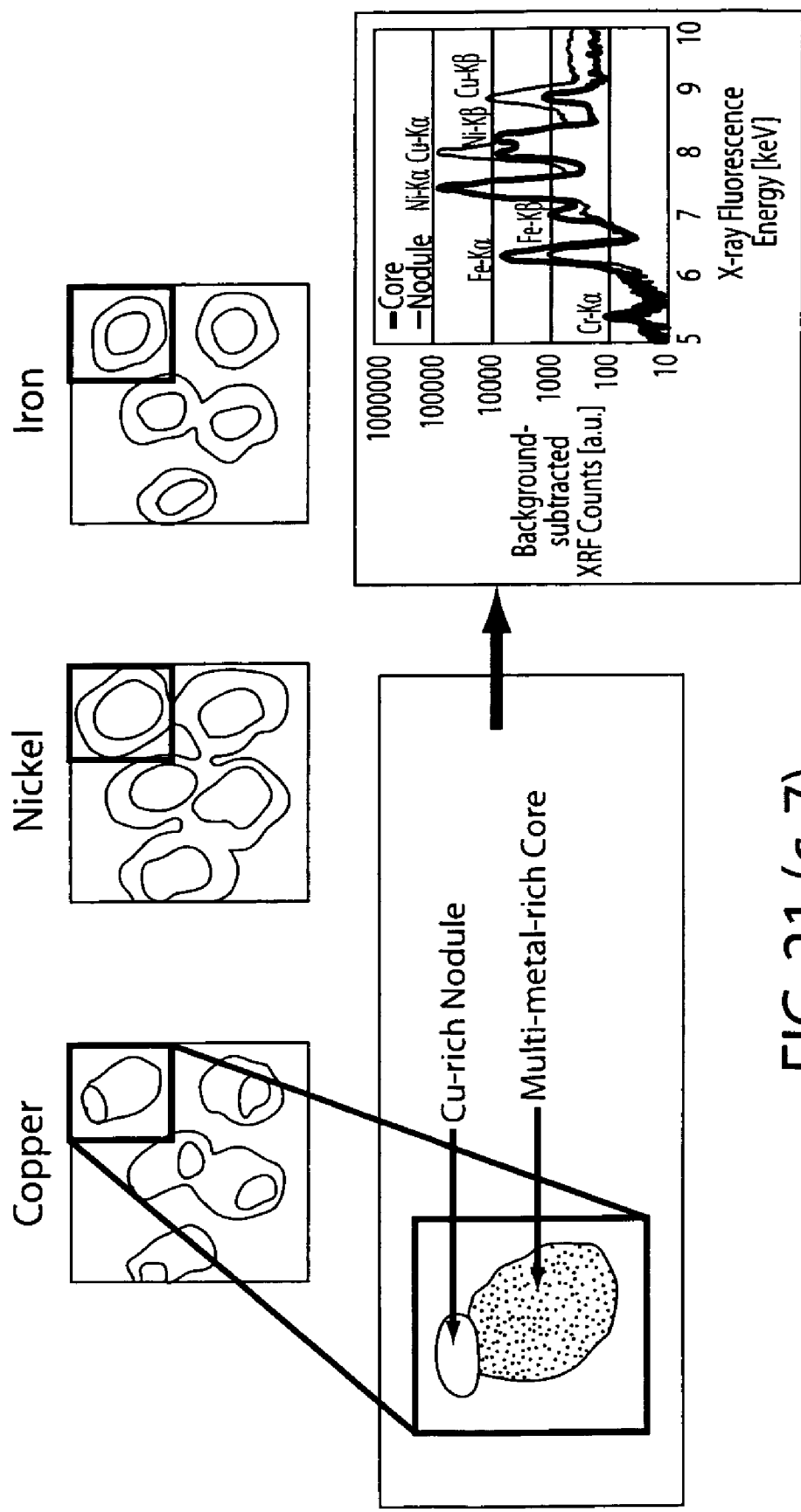
FIG. 21 (c-7)

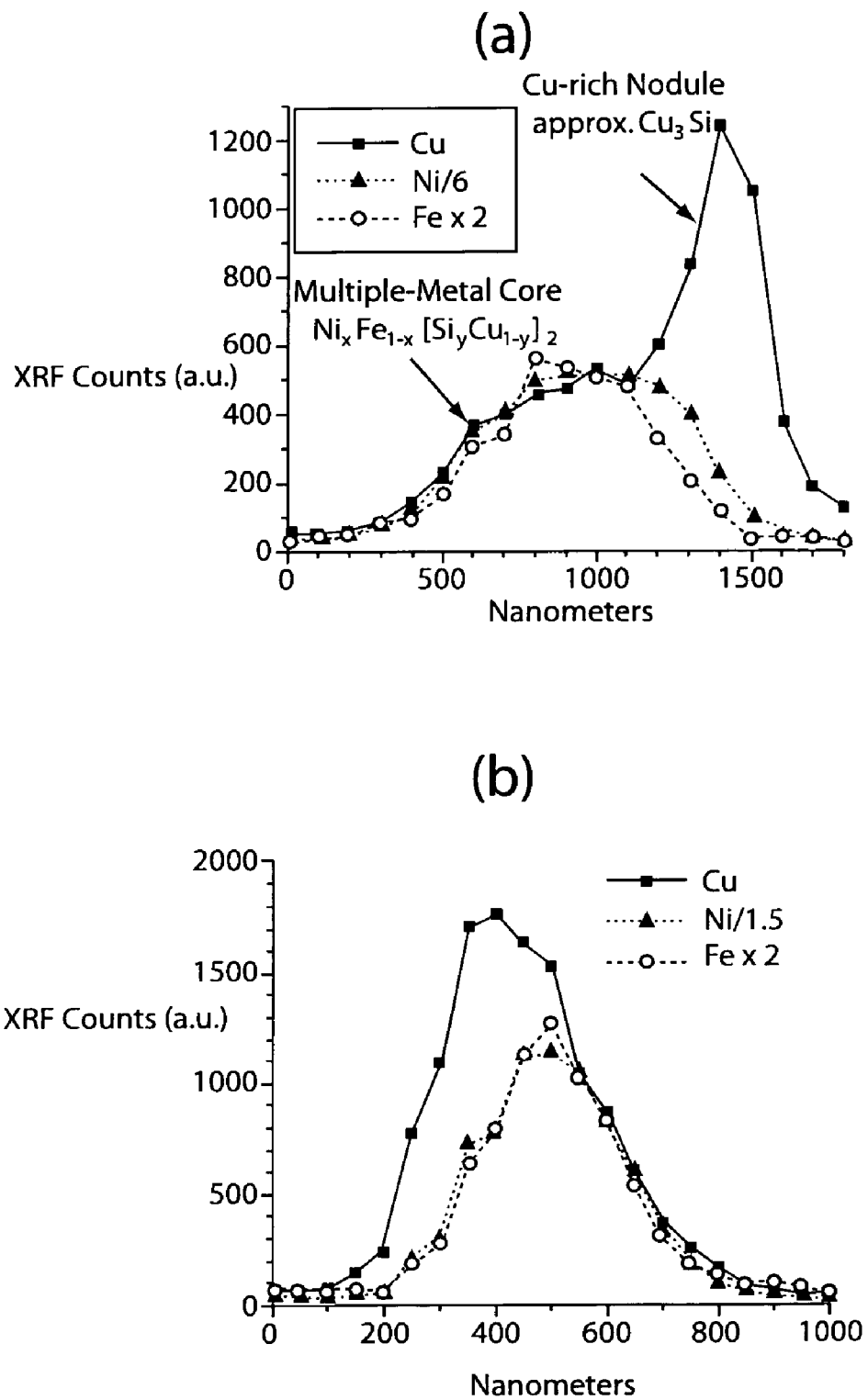
FIG. 22 (c-8)

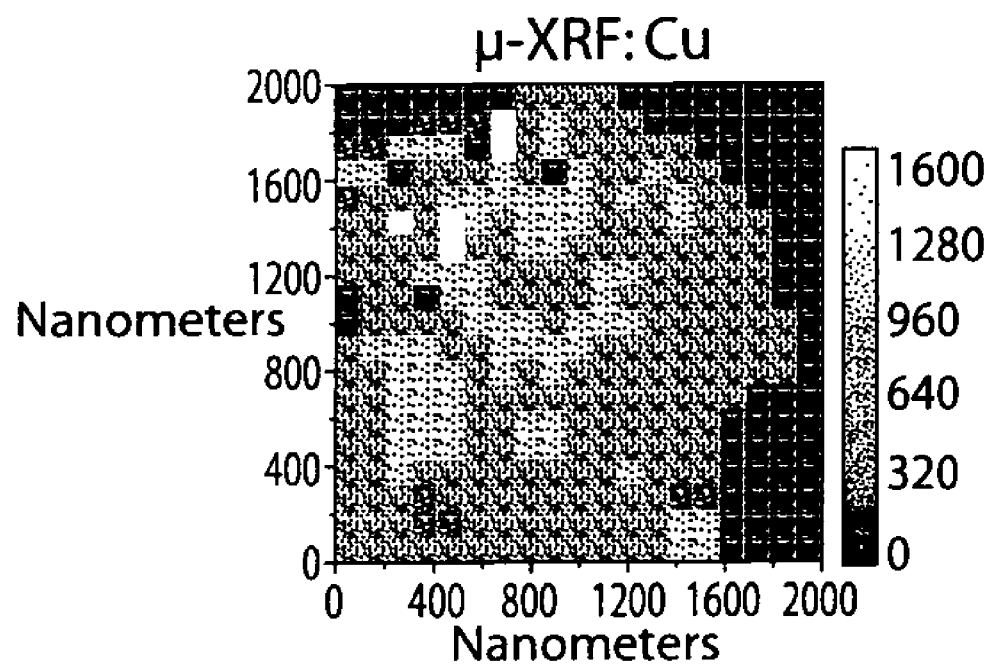
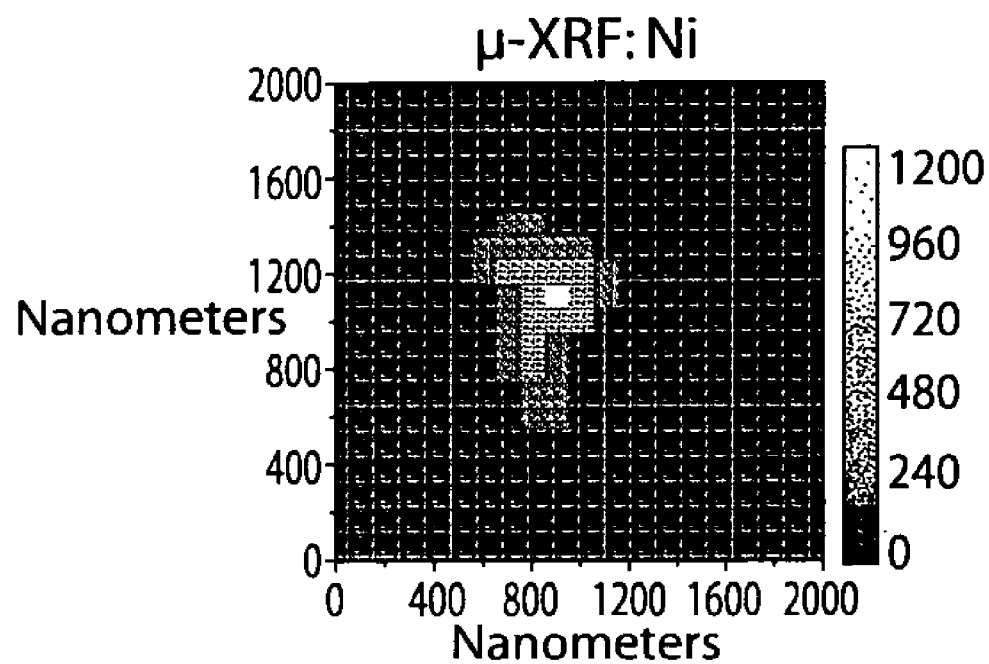
FIG. 23 (c-9)

INTERNAL GETTERING BY METAL ALLOY CLUSTERS

CROSS-REFERENCE TO RELATED APPLICATIONS

This application claims priority under 35 U.S.C §119 from U.S. provisional patent application Ser. No. 60/688,041 filed Jun. 7, 2005 the entire contents of which is incorporated herein by reference for all purposes.

STATEMENT REGARDING FEDERALLY SPONSORED RESEARCH OR DEVELOPMENT

This invention was made with government support under Grant (Contract) No. ATT-2-31605-03 awarded by the Department of Energy. The Government has certain rights to this invention.

BACKGROUND OF THE INVENTION

1. Field of the Invention

The present invention relates to methods and systems for concentrating metals into clusters within semiconductors, including novel structures and compositions of materials formed thereby, and also to the use of such clusters as sites for the collection and concentration of substances within such semiconductors. More particularly, the present invention relates to the concentration of transition metals in silicon into discrete clusters, the use of such clusters in internal gettering, and the resulting improvement in the properties of silicon.

2. Description of Prior Art

Silicon is one of the most abundant elements found within the earth's crust and is used in a variety of technical fields including integrated circuits (ICs), solar cells, micro electro mechanical systems (MEMS), and the like. The solar cell industry is growing rapidly and is responsible for an increasing amount of the silicon consumed, to the point that the silicon needs of the solar cell industry are starting to compete with the silicon needs of the IC industry. With present manufacturing technologies, both the IC and solar cell industries require a refined, purified, silicon feedstock as a starting material.

The purity requirements for the silicon feedstock for the solar cell industry are typically not as stringent at those for the IC industry. In fact, the solar cell industry can sometimes use recycled, scrapped, or rejected silicon material from the IC industry. However, metal impurities such as Fe, Ti, and the like are known to decrease the solar cell conversion efficiency leading to poor performance and a poor cost-to-performance ratio. These impurities may be removed utilizing a variety of well known techniques for purifying silicon, but this adds additional cost to the solar cell manufacturing process and reduces the profitability of the enterprise. Furthermore, if these impurities are homogeneously distributed throughout the material, the performance of the material in the solar cell application may be reduced. If the impurities can be concentrated and segregated into isolated regions within the material, the performance of the material as a solar cell may be improved even though the total amount of dangerous impurities within the material has not been reduced.

Therefore, there exists a need in the art to concentrate and/or isolate metal contaminants in a material, such as that used for the manufacture of solar cells, or to process the material in such a manner that the metal contaminants are less likely to have a negative effect on the performance of the material. Additionally, there exists a need to understand the structure, material composition and/or performance of the materials so that additional beneficial materials and systems can be conceived, developed, and employed for useful ends.

SUMMARY OF THE INVENTION

Accordingly and advantageously, the present invention relates to the formation of metal alloy clusters within semiconductor materials, to the structure and composition of such clusters, and to the use of such clusters in the improvement of the properties of the semiconducting material.

It is one objective of some embodiments of the present invention to provide systems and methods for processing materials to isolate and/or segregate metals or other contaminants in semiconductors and thereby improve the material's performance.

It is another objective of some embodiments of the present invention to improve the performance of a semiconductor by internal gettering.

It is yet another objective of some embodiments of the present invention to provide cost-effective processes and systems for improving the performance of semiconductors.

It is another objective of some embodiments of the present invention to provide novel intermetallic compositions of matter, that are typically useful for the isolation and/or segregation of contaminants in semiconductors.

Some embodiments of the present invention, describe methods for the processing of materials whereby relatively low melting point metal alloy clusters (that might be eutectic phases) are formed that may serve to getter contaminant materials, thereby concentrating and/or isolating the contaminants, typically along defect structures such as dislocations, grain boundaries, and the like. This concentration/isolation can render such contaminants less effective in degrading the performance of the material even though the total amount of contaminant within the material may not have been reduced. The resulting contamination-doped metal alloy clusters may remain in the interior of the bulk material. In some embodiments of the present invention, the constituents of these metal alloy clusters are pre-existing within the material, perhaps due to previous processing steps or present in the as-acquired material.

In some embodiments of the present invention, the constituents of the metal alloy cluster are purposefully added to the material during the practice of the processing method. The addition of such materials (often considered "impurities" in other contexts) can be helpful in improving the properties of the material by "balancing" the components needed for the effective formation of metal alloy clusters, thereby facilitating the formation of metal alloy clusters, and thereby resulting in more effective gettering within the material. Thus, although the material may contain a greater number of "impurity" atoms following processing by these embodiments, these atoms are more effectively localized and isolated within clusters causing the overall properties and/or performance of the material to be improved.

In some embodiments of the present invention, the metal alloy cluster phase may be selected such that its melting point is below the melting point of the bulk material and may form liquid phases at certain temperatures within the solid bulk material. These liquid phases may have improved abilities to getter and concentrate the contaminants within the bulk material.

In some embodiments of the present invention, the time-temperature diagram/history of the process may be selected to allow sufficient time for the contaminants to diffuse through the bulk material and be captured by the metal alloy cluster phases.

In some embodiments of the present invention, a composition of the metal alloy cluster phase is described that results in a crystal structure of the precipitates that is advantageous for gettering and concentrating some contaminants within the bulk material.

These and other advantages are achieved in accordance with the present invention as described in detail below.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not to scale.

The techniques of the present invention can readily be understood by considering the following detailed description in conjunction with the accompanying drawings, in which:

FIG. 7(A-1) depicts a μ-XRF map of a slow-cooled mc-Si sample showing Ni, Fe and Cu.

FIG. 8(A-2) depicts EXAFS data from a sample of slow-cooled Si.

FIG. 9(A-3) depicts EXAFS data and fits for each transition metal edge.

FIG. 10(A-4) depicts the real part of the Fourier transform of the data depicted in FIG. 9(A-3).

FIG. 11(b-1) depicts maps obtained on slowly cooled CZ samples. Ni and Cu μ-XRF maps were measured with a much larger step size than the beam size. Nearly every Ni precipitate had a small amount of copper in it, and vice versa. The scale on the maps is in microns.

FIG. 12(b-2) depicts maps obtained on slowly cooled mc-FZ-Si samples: Ni μ-XRF map (top left), Cu μ-XRF map (top right), and XBIC (bottom left). The intensity scale is in arbitrary units (counts).

FIG. 13(b-3) depicts maps of a CZ sample diffused with metals at 1200° C., quenched, etched, and annealed again at 655° C., XBIC (top), Cu (middle) and Ni (bottom). The vertical dimension of the plots is 0.5 mm.

FIG. 14 (b-4) depicts XBIC, nickel μ-XRF, and copper μ-XRF maps of multicrystalline FZ samples which were intentionally contaminated at 1200° C., quenched and re-annealed at 655° C.

FIG. 15 (c-1) depicts (a) A typical binary metal-silicon phase diagram, with labels identifying the solidus maximum ($S_{max}$) and dissolved metal concentration at the eutectic temperature ($S_{eu}$, $T_{eu}$). (b) Simple precipitation: A sample cools from high temperature, with dissolved metal concentration less than $Se_{eu}$. 1: Metals remain dissolved in silicon, until the solvus is intersected. 2: Metals progressively precipitate into the silicon-rich silicide. (c) Internal eutectic formation: A sample cools from high temperature, with dissolved metal concentration greater than $S_{eu}$. 1: Metals remain dissolved in silicon, until the solidus is intersected. 2a: Liquid metal-silicon droplets form and become progressively metal-rich (towards eutectic composition) as the temperature decreases. 2b: Eutectic droplets freeze, expel more silicon, become silicon-rich silicide. Metals precipitate into silicide phase as temperature decreases.

FIG. 16(c-2) depicts metal-silicon eutectic temperatures for various 3d transition metal species. The dotted line indicates the melting temperature of silicon [$T_M(Si)$].

FIG. 17(c-3) depicts the theoretical equilibrium gettering efficiency of iron for different gettering-layer-to-bulk volume fractions and segregation coefficients. According to the discussion in the text, segregation coefficients correspond to gettering at 800° C. (~$10^9$) through 1200° C. (<$10^6$).

FIG. 18(c-4) depicts (a) (top row) A high-resolution μ-XRF scan along a grain boundary in ingot mc-Si, indicating co-precipitation of Fe and Ni where Cu is present. (b) (lower two plots) Metal correlation plots for nine precipitates, some of which are shown in (a). A clear correlation is observed between the concentrations of copper and nickel in each precipitate, and to a lesser extent, the more slowly diffusing iron.

FIG. 19(c-5) depicts metal distributions in SiGe/Si heterostructures contaminated with different (combinations of) impurities. A remarkable difference is observed between samples contaminated with (a) just iron, (b) just nickel, and (c) just copper, and a sample contaminated with all three metals: (d) iron, (e) nickel, and (f) copper. In the sample contaminated with all three metals, a much higher fraction of the metals are in large-diameter (>300 nm) precipitates, and a good correlation between the spatial distributions of iron, nickel, and copper is observed.

FIG. 20(c-6) depicts the X-ray absorption spectrum of a multiple-metal silicide precipitate (thick black line) detected in the SiGe/Si structures which corresponds well with the earlier-identified "H-phase" [ref. c-12], wherein Fe substitutes some Ni, and Cu substitutes some Si. A mixed alloy chemical state, wherein Fe, Ni, Cu, and Si are chemically interacting, is an indication of the liquid past of this precipitate.

FIG. 21(c-7) depicts co-precipitation of Cu, Fe, and Ni when Eq. 3 is satisfied. Top left to right: (4×4) μ² high-resolution synchrotron-based μ-XRF maps of copper, nickel, and iron forming a series of five multi-metal clusters in metal-contaminated mc-FZ. Each cluster contains a multi-metal particle (core) and nodule, aggregating Cr, Fe, Ni, and Cu in one select location (confirmed by the μ-XRF point spectrum, lower right).

FIG. 22(c-8) depicts μ-XRF line scans across precipitates indicating phase separation during cooling, in two materials: (a) intentionally-contaminated multicrystalline float zone, and (b) as-grown, non intentionally-contaminated ingot mc-Si, from near the bottom of the ingot.

FIG. 23(c-9) depicts precipitation of Cu and Ni when Eq. c-3 is not satisfied. μ-XRF scans indicate that Cu precipitates in the vicinity of Ni, and no chemical interactions between Cu and Ni are detected by μ-XAS.

DETAILED DESCRIPTION OF THE INVENTION

Figure 1:
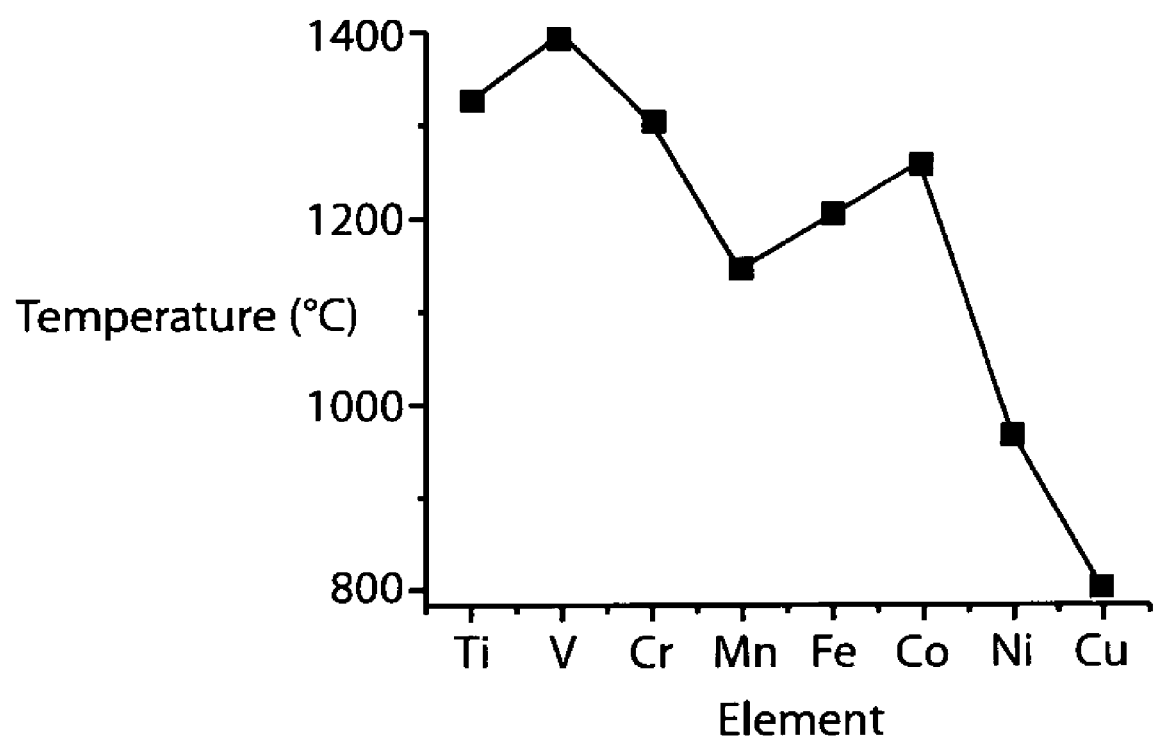
FIG. 1 depicts metal-silicon eutectic temperatures as a function of element, as some indication of trends in behavior that might be observed in metal alloy clusters which are probably not true eutectics.

After considering the following description, those skilled in the art will clearly realize that the teachings of the invention can be readily utilized in the processing of semiconducting materials and the improvement of the properties of such materials.

The present invention relates generally to the formation of metal clusters within semiconducting materials and to the gettering of deleterious substances thereby. "Gettering" generally indicates the collection, concentration, isolation and/or segregation of substances into one or more distinct locations or sites within the material. By "internal gettering" we draw a distinction with "external gettering" which requires gettering sites to be formed on or near a surface of the sample by mechanical or chemical treatment. "Internal gettering" has been used previously to indicate gettering by oxygen precipitates. The present invention adds new types of internal gettering, that is, internal gettering by metal alloy clusters. For brevity, in the following we refer to internal gettering simply as "gettering" in contexts in which confusion is unlikely.

Simply put, metal alloy clusters function as "attractors" for other impurities within the material and collect them in isolated, less harmful, locations within the material—a chemical "trashcan" effect.

It is a difficult experimental question to determine the precise composition and nature of these gettering clusters and, indeed, the properties and compositions are expected to vary in some details from sample to sample and at various stages during the processing of a single sample. Such clusters have been variously referred to by terms such as "liquids," "eutectics," "precipitates," "intermetallics", "alloys" among other terms. However these clusters may be named, the present invention relates to such clusters and to the ability of such clusters to collect deleterious substances into discrete locations within a semiconducting material, and thereby improve the properties of the semiconductor in many cases. For economy of language, we refer herein to such clusters simply as "metal clusters" or "metal alloy clusters" understanding thereby that numerous compositions and structures are likely to be present in various embodiments of the present invention.

Furthermore, some general principles and properties emerge from descriptions of various embodiments of the present invention as presented in detail herein. For example, it is advantageous for the melting point of the metal clusters to be below that of the host semiconductor. That is, were the metal clusters to be considered as an isolated phase having a distinct melting point, the melting point would advantageously be below that of the host material. Thus, the metal clusters in their environment within the host material tend to take on a liquid or liquid-like structure at temperatures below the melting point of the host material, and tend to become solid at a still lower "cluster melting temperature" for the metal clusters. This liquidity tends to facilitate internal gettering by the metal clusters. Furthermore, it is advantageous in the practical gettering of impurities for the metal clusters to have a broad temperature range at which they persist in the liquid state. While this behavior simplifies internal gettering by allowing the process to be practiced with less precise temperature control, it is not a firm requirement as careful time and temperature controls can be implemented when it is advantageous to do so.

While it is advantageous in some embodiments of the present invention for gettering by the metal alloy clusters to occur while the clusters are in a liquid or liquid-like state, this is not an absolute requirement. Solid state reactions are another feasible mechanism by which the clusters can getter atoms within the material and are included within the scope of the present invention.

Furthermore, it is found that the use of more than one transition metal constituent is particularly advantageous in the formation of metal clusters for internal gettering, in particular the "3d transition metals" scandium, titanium, vanadium, chromium, manganese, iron, cobalt, nickel and copper (Sc, Ti, V, Cr, Mn, Fe, Co, Ni, Cu). While metal clusters have been studied in the past, almost all of these prior studies have presumed that metals dissolved in semiconductors interact only weakly with each other, justifying treating multiple dissolved metals, particularly transition metals, as independent entities. On the contrary, various embodiments of the present invention show the particular and unexpected advantages that follow from the use of more than one species of transition metal within a semiconductor in concentrations sufficiently high that interaction between the different transition metal species becomes effective.

In particular, a new approach to internal gettering in silicon is described in detail, involving metal alloy clusters that include more than one metal constituent. The improvement in the properties of the silicon that can result is also described. The possibility thus presents itself of using the procedures and materials of the present invention to produce silicon photovoltaic material at a cost much less that that obtainable by other processes, and thereby make solar energy practically available at a moderate cost.

Our primary focus herein relates to the improvement of properties of semiconductors, particularly silicon, by means of internal gettering with metal alloy clusters. However, it is anticipated that the gettering properties of metal alloy clusters would be present, and also produce beneficial effects, in other semiconductors wherein such clusters can be formed. In particular, when such metal alloy clusters are formed and have melting temperatures below that of the host semiconductor, one is most likely to observe favorable internal gettering properties similar to those reported herein for silicon. For elemental semiconductors, particularly germanium, the formation and gettering properties of metal alloy clusters are expected to be most similar to that to silicon and, thus, most likely to produce beneficial effects.

Application of the techniques described herein to solar cells is by way of illustration and not limitation. The procedures described herein for gettering deleterious contaminants can be employed in any environment in which such contaminants adversely affect the performance of the device and are to be removed or segregated to less-harmful locations. For economy of language, the exemplary gettering and concentration of transition metals in silicon will be described. However, it will be clear to those skilled in the art that similar procedures may be employed to getter and concentrate other types of contaminants. Typical examples of applications that may benefit from the present invention comprise electronic and optoelectronic devices, integrated circuits (among others) in addition to solar cells. However, for relatively expensive per-item devices (such as integrated circuits, sensors, among others), more expensive purification procedures are typically employed, but the procedures described herein are nevertheless applicable. One should not overlook the possibility that the form of internal gettering described herein may lead to a marked reduction in the cost of semiconductor electronic devices and permit their use in disposable and/or high-volume consumer applications not presently cost-effective.

Some embodiments of the present invention include methods for increasing the performance of silicon solar cell material by concentrating performance-limiting metals into isolated clusters and locations via a novel "metal cluster" internal gettering mechanism. Internal gettering of deleterious metals, typically transition metals such as Fe, Cr, Mn, Ti, and V among others, typically occurs at droplets of intermetallic or alloy phases having sufficiently low melting temperatures (or possibly a sufficiently low eutectic temperature), advantageously below about 1000° C. or in the range from about 600° C. to about 1200° C. This may include Cu and/or Ni intermetallic phases formed with bulk Si.

More generally, the eutectic or melting temperature should be below the melting temperature of the host material so that a temperature range exists in which a liquid or liquid-like phase is present along with a solid host. While it is advantageous that this co-existence temperature range be relatively wide, this is not an absolute requirement as narrow ranges may also be encountered and used. Examples of the eutectic temperatures for a range of intermetallic compounds formed with Si are shown in FIG. 1.

Furthermore, it is typically advantageous for the eutectic or melting temperature to be as low as possible. For example, in the case of some ternary, quaternary or other multi-component alloys, it is anticipated that the eutectic (or, more generally the alloy melting temperature, hereinafter simply "eutectic/melting") can be below about 600° C., perhaps well below. In fact, for some materials (typically containing In or Ga) the alloy eutectic/melting temperature could be only modestly above room temperature. In summary, while a lower eutectic/melting temperature is favorable for some embodiments of the present invention, the range presently found to be advantageous for the internal gettering of metals in silicon may be less than 1200° C. and advantageously in the range from about 600° C. to about 1000° C.

Eutectic/melting temperatures are typically lower in a ternary system in comparison with a binary system. Therefore, ternary systems are typically advantageously employed in connection with various embodiments of the present invention, but binary systems are not excluded. Indeed, the present invention is not limited to two-component phases as multi-component phases having three or more components can be advantageously employed in connection with some embodiments. Example A following presents examples of novel phases advantageously employed in connection with internal gettering processes.

In addition to sufficiently low eutectic/melting temperature, it is advantageous in some embodiments of the present invention for the metals to have a sufficiently high diffusion coefficient, allowing thereby the metals to reach the developing cluster in reasonable times. However, this is an advantageous condition and not a firm necessity as sufficiently careful processing and/or time-temperature conditions can adjust for various conditions of diffusion.

Also, the relative concentration of the deleterious metal in the metal alloy cluster (the segregation coefficient) should be sufficiently advantageous that adequate metal may be removed from the bulk of the host material and reside in the (relatively less harmful) metal alloy cluster. That is, the solubility of the deleterious metal in the cluster should exceed (or greatly exceed) the solubility in the host material; a criterion almost always met in practice. Various systems of metal and host meeting these general criteria of segregation and kinetics would all be candidates for the internal gettering by metal alloy clusters as described herein.

To create metal alloy clusters for the particular example of silicon solar cells, the concentration of Cu and/or Ni should typically be greater than about $10^{13}$ atoms/cm$^3$. Advantageously the concentration should be above that of the concentration of the transition metal to be gettered. Different concentrations may be useful in different semiconductor systems or in silicon with different impurities and/or different impurity concentrations. While "as-is" silicon feedstock samples may have Cu/Ni concentrations in this range, if this is not the case, it may be advantageous for the ultimate performance of the device to intentionally add Cu and/or Ni (Cu/Ni) "impurities" to the material in order to achieve the Cu/Ni concentrations for advantageous formation of metal alloy clusters. Cu/Ni concentrations should typically be above about $10^{13}$ atoms/cm$^3$, or above the concentration for transition (or other deleterious) metal to be gettered.

The focus of the work described herein is the concentration into metal alloy clusters of transition metals in silicon, but this is by way of illustration and not limitation. Metals most desired to be removed from semiconductors are typically the transition metals enumerated above. However other metals as well as alkali and alkali earth metals can also be removed from host materials by the procedures of internal gettering with metal alloy clusters described herein so long as the eutectic/melting temperature and the segregation coefficients for the metals and the host material are suitable.

Other work intentionally adding contaminants during silicon growth include the following: J. R. Davis, A. Rohatgi, R. H. Hopkins, P. D. Blais, P. Rai-Choudjury, J. R. McCormick, and H. C. Mollenkopf, "*Impurities in Silicon Solar Cells*" IEEE Trans. Electron. Dev. 27, 677 (1980); A. Rohatgi, J. R. Davis, R. H. Hopkins, and P. Rai-Choudhury, "*Impurities in polycrystalline silicon solar cells*", in Sixteenth IEEE Photovoltaic Specialists Conference (San Diego, Calif., USA, 1982), p. 44; S. Pizzini, L. Bigoni, M. Beghi, and C. Chemelli, "On the effect of impurities on the photovoltaic behavior of solar grade silicon. II. Influence of titanium, vanadium, chromium, iron, and zirconium on photovoltaic behavior of polycrystalline solar cells", J. Electrochem. Soc. (USA) 133, 2363 (1986); T. F. Ciszek and T. H. Wang, "Silicon defect and impurity studies using float-zone crystal growth as a tool", Journal of Crystal Growth 237-239, 1685 (2002). Such studies typically report that increased impurity contents decrease the performance of clean silicon. However, these studies typically add one metal at a time to otherwise high purity silicon, thus not considering the interactions between metals which is one important feature of the present invention.

High level impurities in silicon have been reported by: R. Jonczyk, J. A. Rand, A. J. Grenko, and J. G. Moyer, "*Effect of high levels of transition metals on SiliconFilm™ sheet silicon material*", in Proc. 19th European Photovoltaic Solar Energy Conference (Paris, France, 2004).

The time-temperature diagram of the present procedures should advantageously allow sufficient time above the eutectic/melting temperature of the intermetallic metal alloy phase to allow for efficient gettering by segregation of metals such as Fe, Cr, Mn, Ti, and V, as well as others, into that phase. That is, it is advantageous in some embodiments of the present invention to cool the material slowly in such a way that sufficient time elapses between the solidification of the host material and the solidification of the metal alloy cluster phase such that adequate gettering can occur by the (still liquid) metal alloy clusters. "Adequate gettering" is a complex concept depending on many factors including: the amount and nature of the impurities to be gettered, their diffusion rates, segregation coefficients and solubilities in the various phases of the material, the planned use of the final material, among many other factors. However, a slow cooldown is typically advantageous in improving the internal gettering process. Additionally, stepwise cooldown can be used with a holding period at one or more intermediate temperatures during the cooldown process. The details of such time-temperature protocols that lead to acceptable gettering by metal alloy clusters can be determined by routine experimentation.

Figure 2:
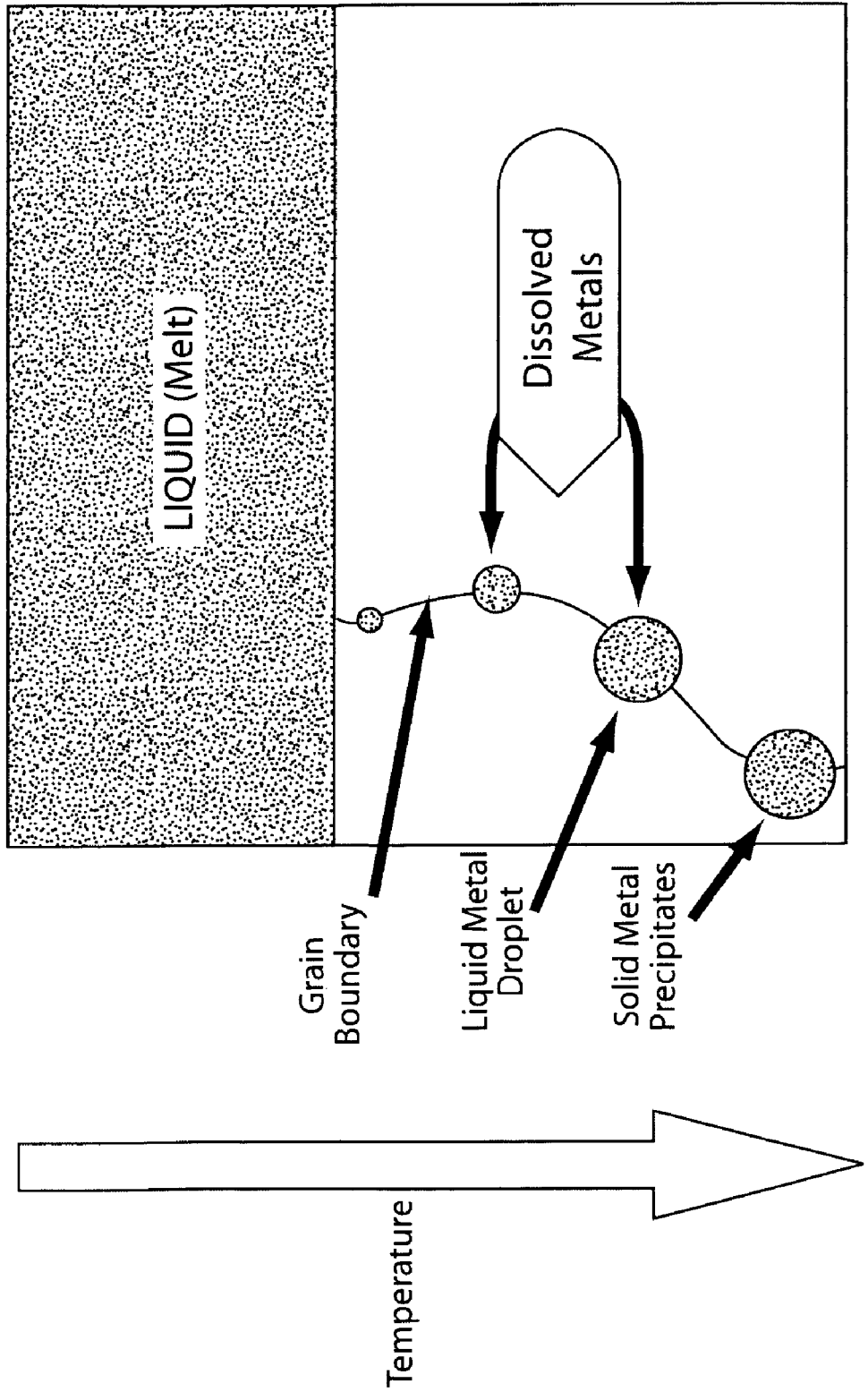
FIG. 2 is a schematic depiction of one possible mechanism for internal gettering.
Figure 3:
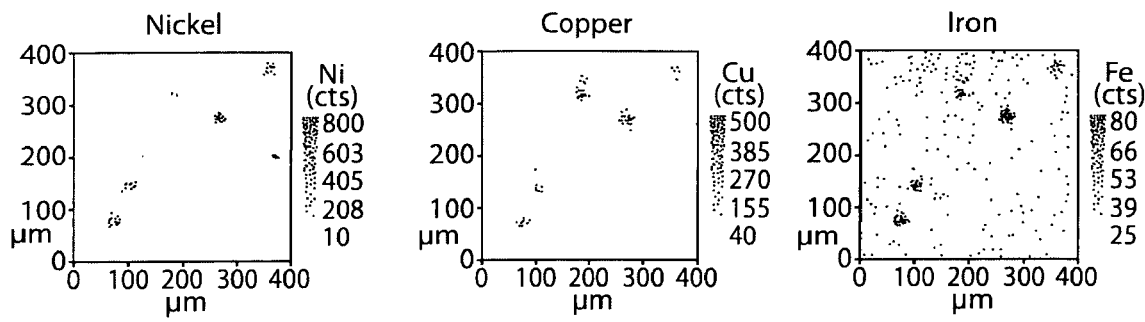
FIG. 3 illustrates μ-XRF maps of Ni, Fe, and Cu for samples processed using the methods of some embodiments of the present invention.
Figure 4:
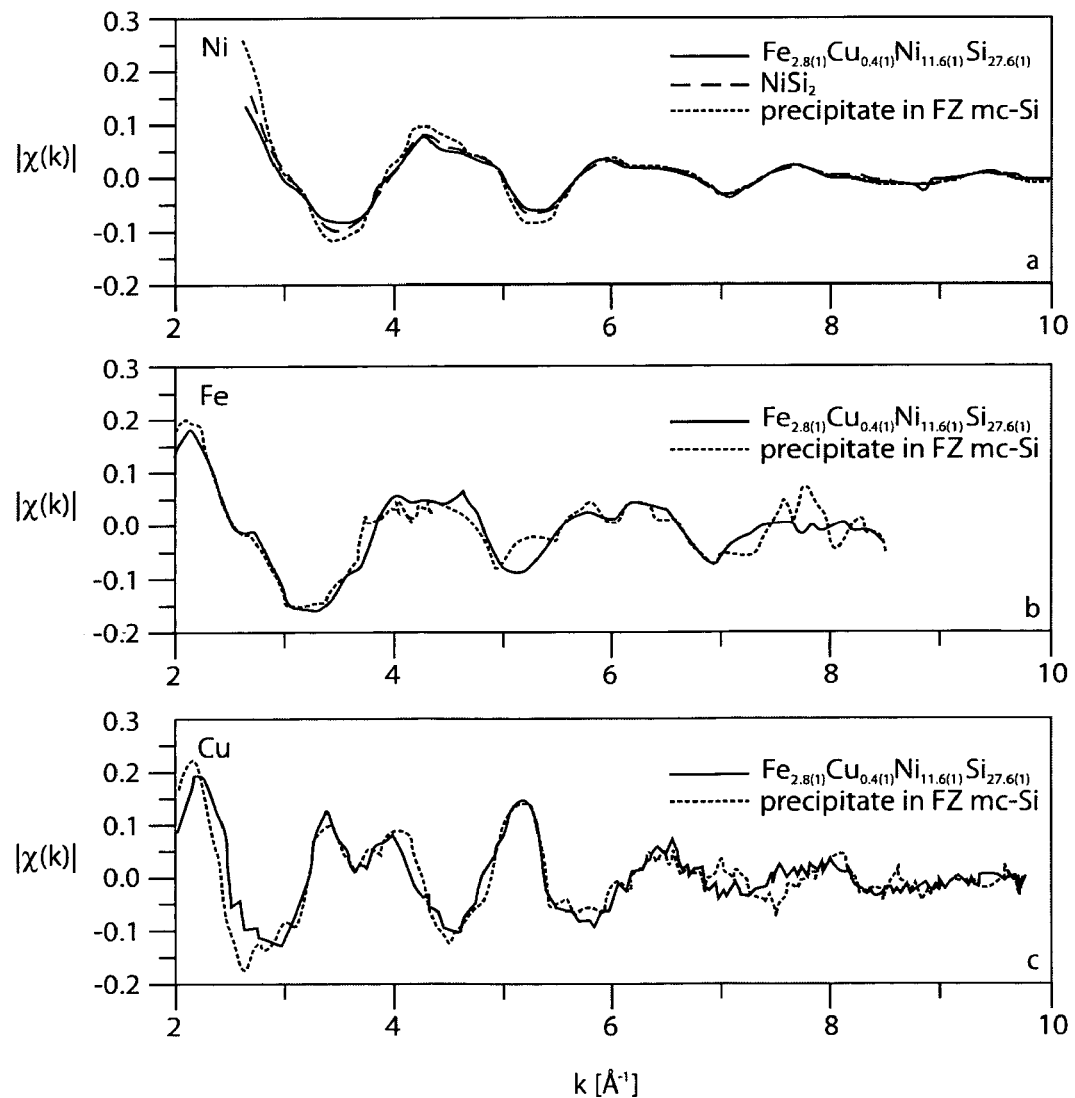
FIG. 4 illustrates EXAFS maps of Ni, Fe, and Cu for samples processed using the methods of some embodiments of the present invention.
Figure 5:
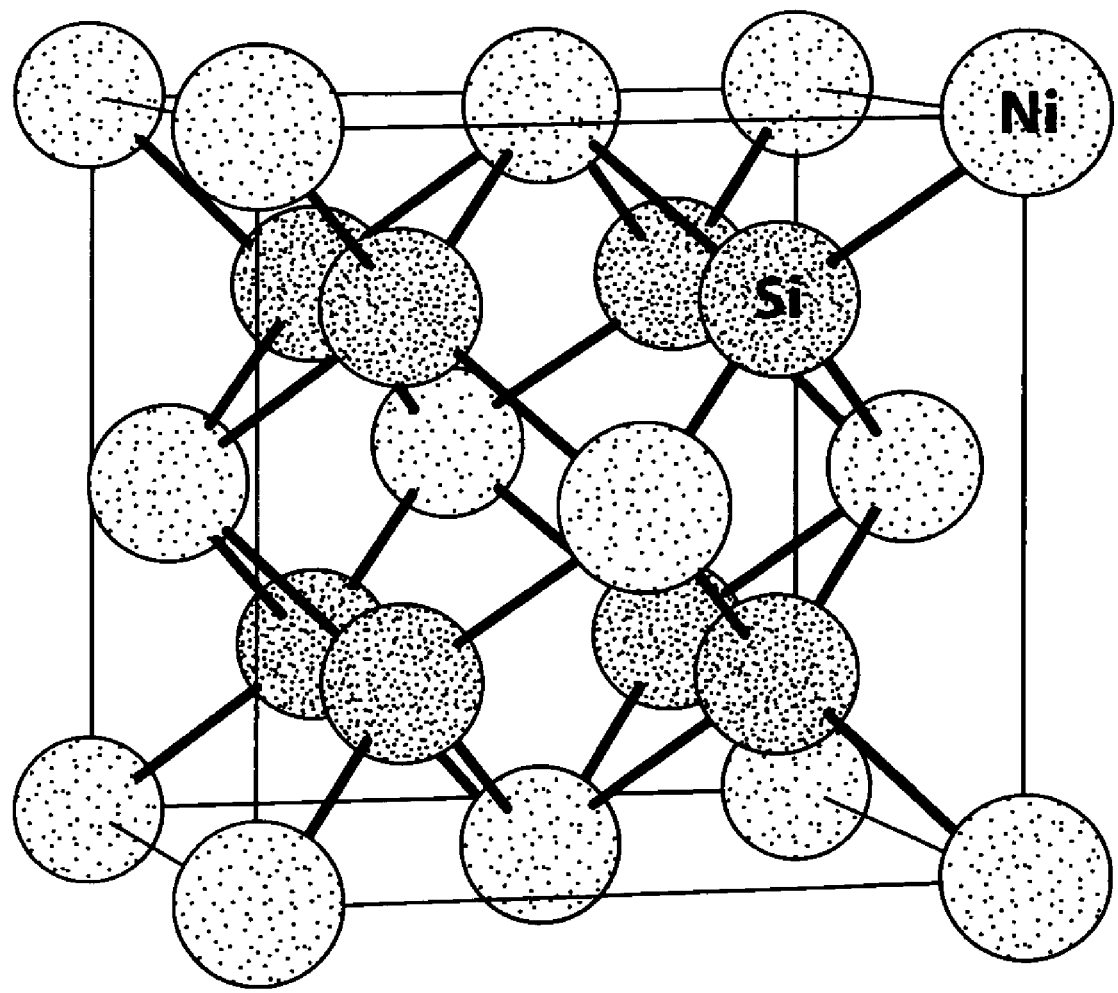
FIG. 5 illustrates the crystal structure of $NiSi_2$.
Figure 6:
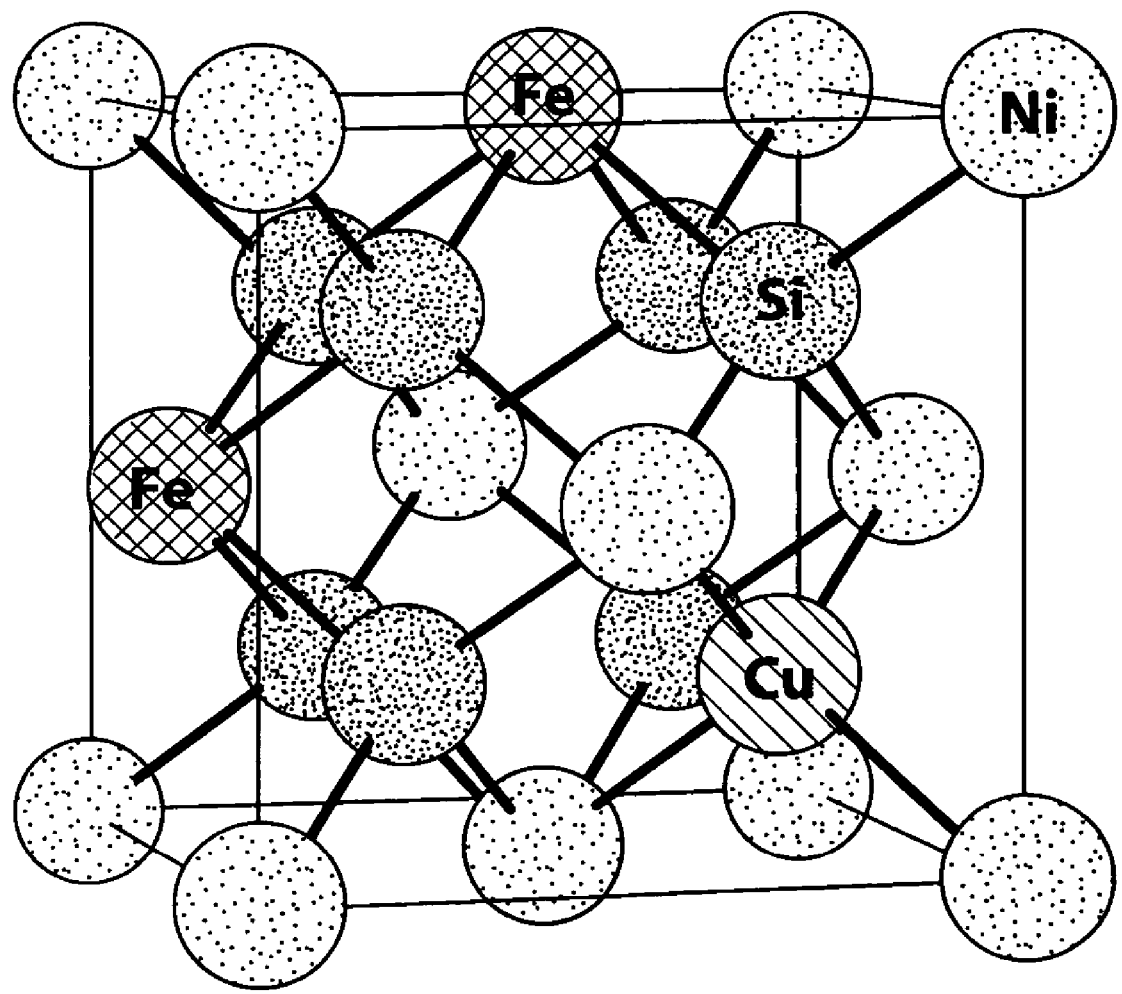
FIG. 6 illustrates the crystal structure of $NiSi_2$ with substituted Fe, Cu substitutions pertaining to some embodiments of the present invention.

Referring now to FIG. 2, one example of a typical progression of cluster formation, contaminant gettering, and precipitate formation pertaining to some embodiments of the present invention is illustrated. As the melt cools, a portion of the contaminants and impurities may be incorporated into the bulk material. At temperatures between the freezing point of the bulk and the eutectic/melting temperature of any intermetallic phases that may form, the intermetallic phases may remain in a liquid state. As indicated, they may segregate at defect sites such as grain boundaries. These intermetallic phases may serve as concentration points for additional contaminants in a gettering process. As the sample is further cooled below the eutectic/melting point, these phases may form solid multicomponent precipitates. The result may be that the contaminants are isolated and concentrated in precipitates segregated along the grain boundaries of the bulk material leaving the bulk of the material relatively pure. This may improve the performance of the bulk material. The effect of metal-rich precipitates on minority carrier diffusion length has been studied by Buonassisi et al, Applied Physics Letters, Vol. 87, 044101, (2005), the entire contents of which is incorporated herein by reference for all purposes.

In addition, a slow cooldown to room temperature after the solidification of the intermetallic cluster advantageously allows additional relaxation gettering to occur, further improving the properties of the resulting material. Additional details of the use of various cooling procedures for various materials are given in Example B below. Thus, in summary a metal-silicon mixed alloy phase is used to getter transition metals, thereby removing them from the active device regions and improving device performance.

Gettering of transition metals by means of a nickel-silicon eutectic layer placed on the outside of a piece of contaminated silicon ("external gettering") has been discussed by Goetzberger and Shockley, "Metal precipitates in silicon p-n junction," Journal of Applied Physics 31, 1821-1824 (1960). Other workers have demonstrated the external gettering effectiveness of aluminum-silicon eutectic layers applied to the backside of the wafer for externally gettering metals. In general, gettering to a eutectic liquid phase can be an advantageous gettering mechanism with a large segregation coefficient due to the typically higher solubility of metals in the liquid phase relative to the solid. Aluminum gettering is currently used in the photovoltaic industry to make cost-effective solar cells as well as the ohmic back surface contact and back surface field. Examples include the following: H. Hieslmair, S. A. McHugo, and E. R. Weber, "*Aluminum backside segregation gettering*" 25th IEEE Photovoltaic Specialists Conference (Washington D.C., USA, 1996) p. 441 and S. M. Myers, M. Seibt, and W. Schröter, "*Mechanisms of transition-metal gettering in silicon*", Journal of Applied Physics 88, 3795-3819 (2000).

In contrast, the procedures described herein employ internal gettering with typically Cu and/or Ni metal alloy clusters formed within the silicon material rather than an external gettering layer applied to the outside of the material. The present methods cause the otherwise dangerous metals to have a beneficial effect, that is, by forming metal alloy clusters in isolated, less-deleterious, locations within the material and thereby getter or collect in a "trashcan effect" additional harmful impurities. Since the metal alloy clusters described herein are located on the interior of the silicon material, the diffusion distances of metals to the droplets is shorter than is typically the case for external gettering processes. Thus, gettering of slow diffusing metals may be improved pursuant to various embodiments of the present invention. Furthermore, the use of intermetallic clusters (typically having a lower eutectic/melting temperature than that of a single-metal cluster) may be advantageously used in connection with some embodiments of the present invention.

It has been noticed that the addition of small amounts of copper can change the electrical properties of the material, for example: S. K. ESTREICHER, "Copper, lithium, and hydrogen passivation of boron in c-Si", PHYS REV B 41, 5447-5450 (1990) and J.-G. Lee and S. R. MORRISON J Ap. Phys. 64, 6679-6683 (1988). The physical mechanism of this phenomenon ("copper passivation") is fundamentally different from the procedures described herein, not involving a eutectic (among other differences).

Further details of the methods for forming metal alloy clusters, and the structures and compositions of the resulting materials appear below. These examples typically relate to the formation of metal alloy clusters and internal gettering in silicon, by way of illustration and not limitation as other systems having the physical and chemical characteristics described herein can lead to the formation of metal alloy clusters and internal gettering, as will be apparent to those having ordinary skills in the art.

The typical form of silicon employed in solar cells is commonly referred to as "multicyrstalline silicon" or mc-Si. "Polycrystalline silicon" is a term also applied silicon having numerous grains and, in typical common usage, often refers mc-Si as well. For economy of language we will typically use mc-Si (or "crystalline" silicon) to refer to silicon having numerous grains and not distinguish multicrystalline from polycrystalline. Single crystal silicon is difficult and expensive to procure with present technology. However, some of the effects described herein may also be observed in single crystal silicon (typically effects not critically depending on the presence of grain boundaries), as will be apparent to those having ordinary skills in the art. In such cases, "crystalline" will be taken to include single crystal samples as well.

Example A

Ni, Fe, Cu, Si Clusters in Multicrystalline Silicon

The contents of all references cited in this Example A are incorporated herein by reference for all purposes.

A.1: Summary

We have observed a new alloy phase (or an "intermetallic phase" as more precisely used in the field) with fluorite-type structure containing Ni, Fe, Cu and Si. This new intermetallic phase has been created and observed in the form of precipitates in multicrystalline silicon (mc-Si). The analysis of measurements by extended X-ray absorption fine-structure microspectroscopy ($\mu$-EXAFS) on the K-edges of the transition metals of the precipetates, in comparison with similar measurements on a synthetic reference material with composition of $Ni_{0.82}Fe_{0.21}Cu_{0.02}Si_{1.94}$, tends to support this phase having a structure similar to $NiSi_2$ but having mixed occupancies of Fe on the Ni-site and Cu on the Si-site. This observation provides evidence that transition metals interact within silicon and form complex silicides.

A.2: Experimental Results

Transition metals in silicon, such as iron, copper, and nickel, are commonly considered to be among the most detrimental contaminants in silicon. Such metals can degrade the electrical performance of a silicon device in concentrations as low as about $10^{10}$-$10^{11}$ atoms per $cm^{-3}$ (or simply $cm^{-3}$). The significance of transition metal contamination in silicon has led to numerous publications as recently reviewed in references a-1, a-2 and a-3 given below. Transition metal contamination in silicon generally increases recombination efficiency and is considered to be an important mechanism leading to degraded electrical performance in solar cells as well as in other silicon devices. This significance of transition metals for silicon materials science and technology has motivated extensive studies and numerous publications. The generally accepted point of view is that the transition metals are found in silicon as interstitial or substitutional species, point defect complexes (e.g., interstitial-substitutional pairs), or single-metal silicide precipitates, such as $Cu_3Si$ or $NiSi_2$. Interactions between different metal species has been substantially ignored (an exception being ref. a-4). In lieu of accurate data, it was often assumed that when several metals are present in the sample they do not interact, although they may co-precipitate at the same location.

We have observed evidence of chemical interaction of different transition metals within silicon and the formation of an intermetallic phase not apparently known previously. The presence of this intermetallic phase within silicon, and its means of formation, may be used to getter detrimental transition metals into isolated, and less harmful, regions of the silicon sample and, thus, improve the performance of the silicon device.

It is known that the electrical properties of silicon are not directly related to the total metal content since metals can occur in different active forms within the material, i.e., homogeneously dissolved as well as locally concentrated in precipitates. Hence the chemical states of these metals (which relate to, and are affected by, the environment of the metal atoms) are of great importance in determining the electrical properties of silicon. Traditionally, the chemical states of metal-rich clusters have been studied by intentionally contaminating single-crystalline silicon with very high amounts of one elemental species and analyzing the resulting precipitates by diffraction methods based upon transmission electron microscopy, or by energy dispersive x-ray spectroscopy (EDX). With the development of new synchrotron based microprobe analytical techniques with high sensitivity and spatial resolution, it is now possible to detect and characterize metal precipitates in silicon very efficiently in more detail and with high accuracy. In the work described herein µ-EXAFS was used to identify and describe a complex Ni-, Fe-, Cu-silicide compound forming in Si simultaneously contaminated with multiple metal species. Such a family of compounds is particularly significant for silicon since its formation provides a local concentration of different transition metals, causing them to be typically less harmful than when such metals are present in a different form, typically in a homogeneously dissolved form.

Highly sensitive synchrotron based x-ray microscopy techniques make it possible to detect metal precipitates in silicon as small as 18 nm in radius and in-situ determine their elemental composition and chemical state (ref. a-5, a-6). Application of these techniques to metal-contaminated multicrystalline silicon (mc-Si) samples enabled us to obtain evidence of chemical interaction between Fe, Cu, and Ni with the formation of a so far unknown intermetallic phase. Analysis of x-ray absorption spectra of this phase by means of computer modeling enabled us to determine its crystal structure.

Our production and analysis of a Ni, Fe and Cu bearing phase in silicon, has significant implications for the gettering and passivation of metal-related defects in silicon. This problem is particularly important in silicon photovoltaics, where metals are considered the major culprit for losses in solar cell efficiencies (ref. a-7, a-8). Techniques described herein are part of an emerging field of "nanodefect engineering" (ref. a-9) based on reducing the detrimental impact of metals in solar cells (and other environments) by adjusting (or engineering) their spatial distribution and/or chemical state to achieve lower recombination activity of metal clusters, thereby improved performance.

The metal clusters created, observed, manipulated and characterized in this work relate to a variety of silicon materials, including multicrystalline float zone (mc-FZ) silicon, Czochralski grown silicon, and as-grown commercial multicrystalline silicon from cast processes. Our results were obtained on a mc-FZ silicon sample (ref. a-10) which was contaminated with Ni, Fe and Cu by scratching with a wire of the respective element and then annealed at approximately 1200° C. for approximately 2.5 hours, leading to contamination levels of approximately $1\times10^{16}$ $cm^{-3}$ for iron, approximately $1\times10^{18}$ $cm^{-3}$ for copper and approximately $7\times10^{17}$ $cm^{-3}$ for nickel according the maximum solubility of these elements at the given temperature (ref. a-11) Multicrystalline float zone silicon was chosen chiefly because it contains a high density of grain boundaries and provides a high concentration of nucleation sites for metal precipitates. The sample was "slow cooled" from approximately 1200° C. in the furnace for more than 12 hours, whereby the cooling rate was in the approximate range of 25-30 deg. K/min at the start of the cooling period, decreasing to the approximate range of 3-8 deg K/min in the medium temperature range (approximately 800-400° C.), and decreasing to even lower cooling rates by the end of the cooling period. Silicides remaining on the surface of the sample were removed by polishing and chemical cleaning.

To determine the precise location and speciation of metal-rich precipitates inside the mc-FZ sample, synchrotron-based µ-XRF and µ-EXAFS were performed at Beamline 10.3.2 (ref. a-12) of the Advanced Light Source (ALS) at Lawrence Berkeley National Laboratory. The focusing optics of Beamline 10.3.2 were adjusted to achieve x-ray spot sizes from approximately (5×7) to approximately (7×7)µm², at a peak flux of approximately $3\times10^8$ photons/s. This beamline has a Si(111) monochromator with an energy resolution of approximately 1 eV (electronVolt). The ability of µ-XRF (micro-X-ray fluorescence) to detect metal-rich micro- and nanoclusters in silicon is known (refs. a-8, a-13, a-14). Further details of ALS Beamline 10.3.2 can be found in refs. a-12, a-15. Ni and Fe K edge EXAFS were measured at MRCAT (Materials Research Collaborative Access Team) undulator beamline at the Advanced Photon Source, Argonne National Laboratory. A cryogenic double crystal Si (111) monochromator was utilized for x-ray energy selection and an Rh-coated mirror was used for harmonic rejection. The incident photon intensity was measured by an ion chamber filled with a $N_2$ and He mixture. For the Fe K edge EXAFS, x-ray fluorescence intensity was measured by a conventional three-grid Stern-Heald type ionization chamber detector filled with Ar gas. Absence of fluorescence correction was ensured by comparison with transmission EXAFS.

Ni K edge EXAFS were measured by transmission mode. For all the scans, simultaneous measurement of reference foils eliminates the possibility of energy shifts in the series of scans.

In addition to precipitates containing only one or two metal species, µ-XRF maps of many different slow-cooled mc-Si samples as well as the mc-FZ material frequently revealed metal-rich precipitates simultaneously containing Ni, Fe and Cu (FIG. 7(A-1)). µ-XRF analyses on several multi-metal precipitates consistently yielded a Ni:Fe:Cu ratio of approximately 10:~1:3 with a uncertainty of about 3-5%. To study the chemical nature of these clusters, µ-EXAFS measurements were performed at the K-edges of Ni, Fe and Cu. Because each compound has a unique EXAFS spectrum, a good correlation between µ-EXAFS spectra from the precipitates in silicon and reference materials, which are well characterized in structure and composition, yields a positive identification of chemical state.

To get an idea which phases could have formed, a Ni—Fe—Cu silicide sample was synthesized using an initial stochiometry following the overall Ni:Fe:Cu ratio from µ-XRF measurements on the precipitates, and a transition metal to silicon ratio of 1:2, which corresponds to the most Si-rich phase of the Metal-Si system (i.e., $MSi_2$). According to this initial ratio, high-purity powders (99.999%) of the elements silicon, iron, nickel and copper were mixed and homogenized by melting in a $SiO_2$ crucible at 1600° C. The resulting melting ball was placed in an evacuated silica ampoule and annealed at T=1000° C. for seven days and then quenched in water.

The synthesis product was checked by an XRD measurement on a Seifert XRD3000 diffractometer (30 mA/40 kV; Bragg-Brentano geometry) equipped with a graphite (002) diffracted-beam monochromator and a scintillation detector. The powder-diffraction pattern, recorded from 5° to 100° 2θ with a step size of 0.05° 2θ and 2 s/step, confirmed that the resulting material was a mixture of silicon, two phases structurally similar to $NiSi_2$ (referring to the Joint Committee for Powder Diffraction Studies, JCPDS, standard number 43-0989) and smaller amounts of another phase similar to $Cu_3Ni_{10}Si_7$ (JCPDS 03-1061).

The chemical composition of the reference sample was then determined by electron microprobe analysis using a CAMECA SX100 operating at 15 kV/20 nA and using calibration standards of synthetic NiO, $CuFeS_2$ and $CaMgSi_2O_6$. It was found that the composition of the main phase in the reference sample is $Ni_{0.83(1)}Fe_{0.20(1)}Cu_{0.03(1)}Si_{1.97(1)}$. The secondary phases, $Ni_{1.01(1)}Cu_{0.13(1)}Si_{1.84(1)}$ and $Cu_{0.39(1)}Ni_{0.24(1)}Si_{0.36(1)}$, did not contain iron and were therefore not of interest for a phase identification of the mc-FZ precipitates.

To obtain a homogeneous reference material in a second synthesis, a powder mix was produced with an initial weight according to $Ni_{0.83}Fe_{0.20}Cu_{0.03}Si_{1.97}$, pressed to a pellet and annealed in an evacuated silica ampoule at 900° C. for two days. The product was homogenized by grinding in an agate mortar, pressed again and annealed a second time under the same conditions. The XRD measurement on the resulting material confirmed a single phase similar to $NiSi_2$ (JCPDS 43-0989) with a composition of $Ni_{0.82(1)}Fe_{0.21(1)}Cu_{0.02(1)}Si_{1.94(1)}$ which was determined by electron microprobe analysis.

The comparison of the Ni EXAFS spectra of a) the precipitates in the slow cooled mc-FZ-silicon, b) pure $NiSi_2$ and c) the synthesized reference material confirmed that all these compounds have nickel in the same coordination as the $CaF_2$-type $NiSi_2$ structure (FIG. 8(A-2a)). The very good match between the EXAFS spectra of the mc-FZ precipitates and the standard exists for every measured element, indicating the same atomic site occupancies in both phases (FIG. 8(A-2a,b,c)). Thus, it is obvious that their individual structures just differ in elemental substitutions on the atomic sites of the same structure type.

Further the measured compositions $Ni_{0.83}Fe_{0.20}Cu_{0.03}Si_{1.97}$, $Ni_{1.01}Cu_{0.13}Si_{1.84}$ and $Ni_{0.82}Fe_{0.21}Cu_{0.02}Si_{1.94}$ imply that Ni and Fe share one site of the structure, and Cu and Si the other site, since the summation of the formula units gives: 2[Ni,Fe]=[Si,Cu].

It was possible to confirm this hypothesis by analyzing the EXAFS data measured for Ni, Fe and Cu at the precipitates as well as for the reference material. Note that the oscillations in the Ni and Fe spectra are very similar, which suggests that both elements are in a similar structural environment, i.e., sharing the same site of the structure. In contrast, the oscillations in the Cu spectrum appear very different from the Ni and Fe spectra, implying that Cu has a different structural environment and occupies a different structural site.

Following these considerations, a structure model was developed to analyze the EXAFS data of the reference material. This model is a derivative of the fluorite-type structure of $NiSi_2$ (spgr. $Fm\bar{3}m$), whereby 20% iron and 80% nickel share the Ni-site (4a) and 99% silicon and 1% copper share the Si-site (8c). The cubic lattice parameter a=5.3957(2)Å was determined from the XRD of the reference material using silicon as internal standard to correct the Bragg angles.

It is well established to analyze EXAFS data by modifying an ab initio calculated theoretical standard (ref. a-16). Hereby a sum over multiple scattering calculations is used to predict an EXAFS signal from a structure model and the differences between the calculated and the measured EXAFS signal are minimized using least squares algorithms to find the best-fit set of parameters for the calculated signal. Based on the above mentioned structure model, individual theoretical standards for each elemental EXAFS spectrum (Ni, Fe, Cu) were calculated using the computer program FEFF8 (ref. a-17). Since the proposed structure contains mixed occupancies, which cannot be simulated directly with FEFF8, the final scattering contributions were calculated by a weighted averaging of different boundary situations. For example, the scattering path data for the Cu spectrum were generated by averaging FEFF8 calculations for Cu on a Si-site in pure $NiSi_2$, Cu on a Si-site in a hypothetical "$FeSi_2$" structure and Cu on a Cu-site in hypothetical "$NiCu_2$" structure (both identical to $NiSi_2$). Hereby the weighting scheme referred to the measured composition of $Ni_{0.82}Fe_{0.21}Cu_{0.02}Si_{1.94}$.

The refinements were performed with the program IFEFFIT (ref. a-18) using 8-10 free parameters, including changes in the half path lengths, $\delta R_i$, their root mean square variation, $\sigma^2_i$ and $S^2_0$ and $E_0$ for each metallic element and 17-31 independent points per dataset. Uncertainties in fitted parameters were calculated using the method of Newville (ref. a-19). The refinements achieved good fits for every measured spectrum resulting in R-values between 1 and 2.5%. To visualize the results, FIG. 9(A-3(a-c)) show the EXAFS data and fits for each transition-metal edge and in FIG. 10(A-4(a-c)) the Real parts of the Fourier transform of these data are plotted.

Since it is rather unusual that copper and silicon share an atomic site, the refinements of the Cu spectrum are discussed in more detail in the following. As for the other elements, the refinements were carried out in R-space using a $k^2$-weight of the dataset. Since the Fourier transformed scattering paths showed excessive overlapping from R>3.9 Å, while the resolution of data became insufficient from this point, the fitting space was limited to 1.7 Å<R<3.9 Å that contained scattering contributions from the first four paths. Hereby the two first single scattering paths consider the next neighbor interactions with four Ni—($Cu_0$—$Ni_{1\_1}$—$Cu_0$) and six Si-atoms ($Cu_0$—$Si_{2\_2}$—$Cu_0$), the third contribution is a multiple scattering path resulting from the first and second coordination shell ($Cu_0$—$Si_{2\_2}$—$Ni_{1\_1}$—$Cu_0$) and the fourth path represents a single scattering with the following coordination shell consisting of 12 silicon atoms ($Cu_0$—$Si_{2\_3}$—$Cu_0$). Constraints were defined for the parameters $\delta R_i$, and $\sigma^2_i$ as given in Table A-1. The resulting changes in the half path lengths indicate an expansion of the first coordination (Cu—Ni, see Table A-1) which can be interpreted as the local distortion created by the bigger copper atom, r=1.38 Å (ref. a-20), sitting on the site of the smaller silicon atom, r=1.11 Å (ref. a-20). Related to this expansion, the second coordination shell (Cu—Si) shows a small contraction due to the different Cu—Ni and Si—Ni bond lengths. Based on the resulting $\delta R_i$-values and the structure geometry the Cu—Ni and Si—Ni bond lengths were calculated. Hereby the crystal structure gives the following relations between bond lengths and radial distances: $d_{Cu-Ni} = R_1 + \delta R_1$ and $$d_{Si-Ni} = \sqrt{(R_1 + \delta R_1)^2 + (R_2 + \delta R_2)^2 - 2(R_1 + \delta R_1)(R_2 + \delta R_2)\cos\alpha}$$

where $\alpha$ is the angle between $R_1$ and $R_2$ and $R_i$ are the effective path lengths used in the refinements.

The calculation results in a Cu—Ni bond length of 2.474 (8)Å and a Si—Ni bond length of 2.337 (8)Å which corresponds to a Si—Ni distance of 2.3364 Å in the undistorted structure. Finally, the first and second next neighbors of the undistorted structure are moved into one common coordination shell and the higher coordination shells show lower deviations. Thus, the refined local distortions as well as the good fit support the assumption that copper shares a site with silicon in the $Ni_{0.82}Fe_{0.21}Cu_{0.02}Si_{1.94}$-structure.

Attempts were also made to refine structure models with Cu on an interstitial site or sharing the site with Ni and Fe, but it was not possible to refine these models with resulting R-values under 10% (see FIG. 9(A-3d), 10(A-4d)), which again suggests that Cu occupies the Si site in this compound.

In summary, experimental evidence of the formation of a so far unknown mixed silicide phase with a fluorite-type structure in silicon samples is presented. The analysis of the precipitates was possible using synchrotron based μ-EXAFS measurements. Simulation of EXAFS spectra taken on K-edges of the transition metals combined with analysis of standards synthesized for this study reveal that the silicide phase has a structure similar to $NiSi_2$ but with mixed occupancies of the Ni- and the Si-sites. Thus, nickel and iron share the (4a)-site of the structure, which is reported for various structures because of the similar properties of these elements. On the other hand, copper shares the (8c) site with silicon, which is more rare but is physically and chemically feasible. Similarities in the bonding behavior of Cu and Si are theoretically predicted (ref. a-21), and the shared site occupancy of these elements within intermetallic compounds like $Cu_3Si$ has been reported (ref. a-22). Hereby the variability in composition of the precipitates and the reference material indicates that the investigated structure can act as host for different transition metals.

In the course of these studies, several metal cluster precipitates have been observed having substantially the following crystal structures $NiSi_2$, $Cu_3Si$ and NiSi, and containing a range of metallic constituents (which we identify in short as "$NiSi_2$-type compounds" and similarly for $Cu_3Si$ and NiSi). With recent studies involving transition electron microscopy and energy dispersive X-ray analysis, we have observed the following approximate compositions for the clusters (all mathematical equalities and inequalities noted below are approximate):

(1) $NiSi_2$-type compound: $Ni_{(1-x)}Fe_xCu_ySi_{(2-y)}$: $0 \leq x \leq 0.2$: $0 \leq y \leq 0.18$.

Copper appears to prefer to occupy the Si site of the structure.

(ii) $NiSi_2$-type compound (without Fe): $Ni_{(1-x)}Cu_xSi_2$: $0 \leq x \leq 0.666$.

Copper appears to prefer to occupy the Ni site of the structure.

iii) $Cu_3Si$-type compound: $Ni_xCu_{(3-x)}Si$ $0 \leq x \leq 0.668$.
Showing a Cu—Ni substitution.

(iv) An example of NiSi-type compound was also observed as a precipitate, showing a Cu—Si substitution.
$NiCu_xSi_{(1-x)}$: $0 \leq x \leq 0.03$ In summary, we have observed precipitates containing Ni, Fe, Cu and Si have employing x-ray fluorescence microscopy (μ-XRF). Precipitates have been observed in multicrystalline float zone (mc-FZ) silicon, and also in Czochralski grown silicon, and also in multicrystalline silicon from cast processes. A common characteristic of the materials showing precipitates is typically relatively high contamination with different metal species and a slow cooling rate during processing.

The phenomenon of the formation of solid solution silicides as observed and described herein has implications for the recombination activity of metal precipitates in silicon and their gettering. We anticipate special technical relevance in important renewable energy applications, for example for the fabrication of multicrystalline silicon (mc-Si) solar cells. Phenomena observed and described herein may allow practical solar cells to be fabricated from low cost feedstock silicon containing relatively high concentrations of various metal impurities, and thus achieve a major reduction in the cost of solar energy.

A.3: References Cited in Example A

[a-1] A. A. Istratov, and E. R. Weber, Appl Phys a-Mater 66, 123 (1998).

[a-2] A. A. Istratov, H. Hieslmair, and E. R. Weber, Appl Phys a-Mater 70, 489 (2000).

[a-3] A. A. Istratov, T. Buonassisi, R. J. McDonald, A. R. Smith, R. Schindler, J. A. Rand, J. P. Kalejs, and E. R. Weber, J Appl Phys 94, 6552 (2003).

[a-4] P. He, and Z. P. You, Phys Status Solidi A 125, K31 (1991).

[a-5] O. F. Vyvenko, T. Buonassisi, A. A. Istratov, and E. R. Weber, J Phys-Condens Mat 16, S141 (2004).

[a-6] T. Buonassisi, A. A. Istratov, M. Heuer, M. A. Marcus, R. Jonczyk, J. Isenberg, B. Lai, Z. H. Cai, S. Heald, W. Warta, R. Schindler, G. Willeke, and E. R. Weber, J Appl Phys 97, 074901 (2005).

[a-7] T. Buonassisi, M. A. Marcus, A. A. Istratov, M. Heuer, T. F. Ciszek, B. Lai, Z. H. Cai, and E. R. Weber, J Appl Phys 97, 063503 (2005).

[a-8] S. A. McHugo, A. C. Thompson, A. Mohammed, G. Lamble, I. Perichaud, S. Martinuzzi, M. Werner, M. Rinio, W. Koch, H. U. Hoefs, and C. Haessler, J Appl Phys 89, 4282 (2001).

[a-9] T. Buonassisi, A. A. Istratov, M. A. Marcus, B. Lai, Z. H. Cai, S. M. Heald, and E. R. Weber, Nat Mater 4, 676 (2005).

[a-10] T. F. Ciszek, and T. H. Wang, J Cryst Growth 237, 1685 (2002).

[a-11] E. R. Weber, Appl Phys a-Mater 30, 1 (1983).

[a-12] M. A. Marcus, A. A. MacDowell, R. Celestre, A. Manceau, T. Miller, H. A. Padmore, and R. E. Sublett, J Synchrotron Radiat 11, 239 (2004).

[a-13] A. A. Istratov, H. Hieslmair, O. F. Vyvenko, E. R. Weber, and R. Schindler, Sol Energ Mat Sol C 72, 441 (2002).

[a-14] T. Buonassisi, M. Heuer, 0. F. Vyvenko, A. A. Istratov, E. R. Weber, Z. Cai, B. Lai, T. F. Ciszek, and R. Schindler, Physica B 340, 1137 (2003).

[a-15] A. Manceau, M. A. Marcus, and N. Tamura, in *Applications of Synchrotron Radiation in Low-temperature Geochemistry and Environmental Science*, edited by P. Fenter, and N. C. Sturchio (Mineralogical Society of America, Washington D. C., 2002), p. 341.

[a-16] J. J. Rehr, and R. C. Albers, Reviews of Modern Physics 72, 621 (2000).

[a-17] A. L. Ankudinov, B. Ravel, J. J. Rehr, and S. D. Conradson, Phys Rev B 58, 7565 (1998).

[a-18] M. Newville, J Synchrotron Radiat 8, 322 (2001).

[a-19] M. G. Newville, PhD-Thesis, (University of Washington, 1995).

[a-20] A. M. James, and M. P. Lord, in *Macmillan's Chemical and Physical Data* (Palgrave Macmillan, London, 1992).

[a-21] S. K. Estreicher, Phys Rev B 60, 5375 (1999).

[a-22] J. K. Solberg, Acta Crystallogr A 34, 684 (1978).

A.4: Generalizations

The structures and composition ranges presented in this Example A are those produced and observed in the laboratory. However, it is anticipated that the composition ranges cited do not represent firm limits and different compositions may result under different experimental conditions, limited by the overall disruption of the crystal structure. That is, in $NiSi_2$-type structures it is expected that the structure could contain Cu or Cu,Fe in concentrations up to that at which the $NiSi_2$ structure is substantially disrupted. Similarly, it is anticipated that substitutions of Ni into the $Cu_3Si$ structure, and of Cu into the NiSi structure, are not absolutely limited to the observed numerical ranges cited herein but could exist at higher concentrations, limited by the ability of the crystal structure to accommodate the substituted atoms.

Additionally, it is not expected that the compositions of matter observed herein are limited to the particular substitutions described. That is, substitutions involving one or more 3d transition metal atoms are expected to form structures similar to those observed herein. Cu, Ni, Fe are expected to be the technologically important 3d transition metals and, therefore, were studied in detail. However, the complete range of 3d transition metals (Sc, Ti, V, Cr, Mn, Fe, Co, Ni, Cu) is expected to form compositions of matter and structural phases analogous to those described herein involving Ni, Cu and Fe.

Example B

Precipitation Behavior of Cu and Ni in Silicon

The contents of all references cited in this Example B are incorporated herein by reference for all purposes.

B.1: Experimental Results and Conclusions

We describe observations of the size, chemical state, and spatial distribution of metal clusters formed under substantially different cooling conditions. All samples were scratched on the back with Fe, Cu, and Ni wires and annealed at approximately 1200° C. for approximately 2.5 hours in forming gas ($N_2$+5% $H_2$ ambient).

"Slowly cooled" samples were cooled to room temperature inside the furnace. The cooling took about 12 hours and the cooling rate was about 25-30 deg K/min at the beginning of the cooling period, reducing to about 3-8 deg. K/min in the medium temperature range, and reduced to still lower cooling rates by the end of the cooling period.

"Quenched/reannealed" samples were quenched in silicone oil, cleaned in hot acetone to remove oil residues, etched in $HF:HNO_3$ mixture to remove surface metal-silicides, inserted into a preheated furnace running at about 655° C., annealed for about 2.5 hours, and then slowly cooled in the furnace within approximately 12 hours. These two annealing conditions were combined with two types of samples: Czochralski (CZ) samples with approximately $1.5 \times 10^6$ cm$^{-3}$ of oxygen precipitates, and multicrystalline Si (mc-Si) samples grown using a float zone technique (mc-FZ-Si). Multicrystalline growth was achieved using a seed containing numerous dislocations. The following four samples were analyzed:

(1) a "slowly cooled" CZ sample;

(2) a "slowly cooled" mc-FZ-Si sample;

(3) A "quenched/reannealed" CZ sample;

(4) A "quenched/reannealed" mc-FZ-Si sample.

Although all of these samples were intentionally contaminated with Cu, Ni, and Fe, very low density of iron clusters was found in X-ray fluorescence (XRF) maps. Therefore, the majority of data presented herein relate to Cu and Ni. It is known that iron rarely forms precipitates detectable by traditional analytical techniques such as transmission electron microscopy (TEM). The only experimental condition under which large iron-silicide precipitates were observed by TEM in typical silicon samples were experiments with implantation of large doses of iron into silicon with a subsequent anneal (for example, see ref. b-1 and references cited therein). It appears that iron under such conditions prefers to homogeneously decorate extended defects rather than to form large metal precipitates (where "decorate" denotes the clustering of metals at another defect, such as a dislocation). In addition, the relatively low solubility of Fe in single-crystalline silicon at 1200° C., (which is at least two orders of magnitude less than Cu or Ni), can be a limiting factor for precipitate size.

In the slowly cooled CZ sample, very few decorated oxygen precipitates were visible in X-ray beam induced current (XBIC) and Ni/Cu µ-XRF map (micro-XRF), see FIG. b-1. In the slowly cooled mc-FZ-Si samples (FIG. b-2), a clear image of grain boundaries was observed in the XBIC map. The µ-XRF map of nickel revealed that Ni has very selectively precipitated at some of the grain boundaries. Copper precipitated in much lower concentrations, and copper-related contrasts were barely visible in µ-XRF maps. Even though copper has a higher solubility at the diffusion temperature than nickel, we see a much stronger signal from nickel than from copper. This observation leads to the following two conclusions: First, surface metal silicide, which serves as a source of metals during the high-temperature anneal, acts as a highly efficient sink during cooling. It is possible to estimate how the surface area of a CZ sample with approximately $10^6$ cm$^{-3}$ of oxide precipitates compares with the surface area of the sample. As an example, suppose we have a 1 by 1 cm sample, 0.5 mm thick. Its surface area is 2 cm$^2$, and its volume is 0.05 cm$^3$. Assuming that N=$10^6$ cm$^{-3}$ of oxide precipitates are formed by precipitation of $\Delta O_i = 10^{18}$ cm$^{-3}$ of interstitial oxygen and using the standard value for density of silicon dioxide, the average radius of a precipitate is given by $$r(\text{nm}) = \sqrt[3]{\frac{\Delta O_i(\text{cm}^{-3})}{N(\text{cm}^{-3})}} \times 0.174 = \sqrt[3]{\frac{10^{18}\text{cm}^{-3}}{10^6\text{cm}^{-2}}} \times 0.174 = 1.74\mu m$$

The total surface area of all oxygen precipitates in our sample with V=0.05 cm$^3$:

$$S = 4\pi r^2 \times N \times V = 4\pi \times (1.74 \times 10^{-4}\text{ cm})^2 \times 10^6 \text{ cm}^{-3} \times 0.05 \text{ cm}^3 = 0.019 \text{ cm}^2$$

Hence, the total surface area of oxygen precipitates in the CZ sample is about 100 times less than the surface area of the sample. It is not surprising that near-surface metal silicides are more efficient gettering sites for the dissolved metals than oxygen precipitates, which under the conditions of slow cooling gather the majority of dissolved metals from the wafer bulk.

In mc-FZ-Si samples the density of structural defects is typically higher than in CZ-Si (a rough estimate gives a value of 100 cm of GBs (grain boundaries) visible on each cm$^2$ of the wafer surface, or 5 cm$^2$ of GB area per cm$^2$ of the sample surface area), and therefore a larger fraction of the total metal concentration is found precipitated in the bulk for the same cooling conditions.

The second conclusion is that our observations confirm that precipitation of copper is associated with a greater precipitation/nucleation barrier than precipitation of nickel. This higher barrier is consistent with a large lattice expansion of copper silicide as compared to nickel silicide (refs. b-2, b-3, b-4, b-5) and electrostatic repulsion between interstitial copper and nuclei of copper precipitates in p-type Si (ref. b-6). A larger barrier makes copper more selective in choosing where to precipitate, which leads to a lower density of copper-decorated sites than the density of nickel-decorated sites despite a higher solubility of Cu.

About ten metal precipitates found in the slowly cooled mc-Si sample were analyzed in detail. It was found that the majority of the precipitates contain both Cu and Ni. Statistical correlational analysis between Cu and Ni using all data points in the map revealed that a large fraction of the particles were Ni-rich, with the ratio of Ni to Cu of approximately 3.4. A smaller fraction of the particles were Cu-rich, with the ratio of Cu to Ni of approximately 1.45. Absorption spectra of Cu were found to be similar to Cu$_3$Si only in the particles where Cu dominates.

The precipitation behavior of Cu and Ni in "quenched/reannealed" samples was found to be completely different, see FIGS. B-3 and b-4. In the CZ sample (FIG. b-3) it appears that both Cu and Ni have decorated the same oxide precipitates. The density of decorated oxide particles matched the density of oxide precipitates. For instance, we counted 15 particles in the area of 470 μm by 410 μm. Assuming a 70 microns μ-XRF probing depth, we obtain the density of metal precipitates of approximately 1.1×10$^6$ cm$^{-3}$, which matches the density of the oxide precipitates. Hence, we conclude that all SiO$_2$ precipitates are metal-decorated. The ratio of Ni counts to Cu counts in this sample was in the range of 0.23 to 0.26, which reasonably matches the ratio of Ni and Cu solubilities. In the mc-Si sample (FIG. b-4) all structural defects were decorated. Ni has strongly decorated all grain boundaries and weakly decorated intragranular dislocations. Copper was found on both grain boundaries and dislocations.

One possible and tentative explanation for the observed strong decoration behavior is the following: Rapid quench from the annealing temperature prevents metals from diffusing towards the surface silicides. Once the surface silicides are removed by chemical etching and samples are inserted back into preheated furnace at 655° C., quenched-in metals become mobile and, at the same time remain highly supersaturated. Supersaturation of metals determines the energy gained by a metal when it precipitates and, therefore, the height of potential barrier for precipitation which can be overcome. In such conditions metals can precipitate at sites which would be very unfavorable if the sample were cooled slowly.

In summary, "quenched/reannealed" samples feature much higher density of decorated defects and overall much higher concentrations of Cu and Ni precipitated at structural defects than in the samples which were slowly cooled from 1200° C. In quenched/reannealed samples the detected concentrations of precipitated Cu is greater than that of Ni (which agrees with a higher Cu solubility), whereas in slowly cooled samples the Ni concentration is generally higher than the Cu concentration. One possible and tentative explanation for this difference is the efficiency of surface silicides as a sink for the dissolved metals. Since Cu is a faster diffuser than nickel and since the barrier for nucleation of Cu precipitates is higher than that for Ni, a higher fraction of Cu diffuses out in slowly cooled samples, leaving a relatively high Ni concentration in the bulk. In contrast, in quenched/reannealed samples, where surface silicides are removed and the supersaturation ratio (i.e., the ratio of the interstitially dissolved metal concentration to its equilibrium solubility) is sufficient for easy nucleation of Cu precipitates, both Cu and Ni precipitate in the bulk and the ratio of their measured concentrations better reflects the ratio of their solubilities.

Copper has been extensively used for delineation of defects in silicon; the technique is known as copper decoration (see, e.g., ref. b-7 and b-8). Our results provide direct evidence that the efficiency of this process depends on the cooling regime of the wafer.

The findings of this study contribute to the understanding of the behavior of metal impurities during crystal growth. Faster cooling of ribbon/sheet/ingot is likely to lead to a higher density of small metal precipitates. Slow cooling would stimulate formation of a lower density of larger metal precipitates, which are likely to affect the minority carrier diffusion length to a lesser extent than high density of small precipitates. The range of temperatures where the cooling rate becomes important includes temperatures where dissolved metals become supersaturated but remain highly mobile, i.e., may include temperatures from 1000° C. down to 500° C., depending on the metal. Most cooling regimes used for ingot growth are actually close to what we used in the "slow" cool. Our results suggest that distribution of metals in an mc-Si wafer may be engineered by a heat treatment with a properly designed cooling profile.

B.2: References b-1. A. A. Istratov, H. Hieslmair, and E. R. Weber, *Appl. Phys. A* 70, 489 (2000).

b-2. M. Seibt, H. Hedemann, A. A. Istratov, F. Riedel, A. Sattler, and W. Schröter, phys. stat. sol. (a) 171, 301 (1999).

b-3. M. Seibt and W. Schröter, *Phil. Mag.* A 59, 337 (1989).

b-4. M. Seibt, M. Griess, A. A. Istratov, H. Hedemann, et al, *phys. stat. sol.* (a) 166, 171 (1998).

b-5. M. Seibt and K. Graff, *J. Appl. Phys.* 63, 4444 (1988).

b-6. C. Flink, H. Feick, S. A. McHugo, W. Seifert, H. Hieslmair, et al, *Phys. Rev. Lett.* 85, 4900 (2000).

b-7. T. Yamauchi, Y. Tsumori, T. Nakashizu, H. Esaka, et al *Jpn. J. Appl. Phys.* (*Letters*) 31, L439 (1992).
b-8. W. C. Dash, *J. Appl. Phys.* 27, 1193 (1956).

Example C

Self-Assembled Internal Gettering in Silicon

The contents of all references cited in this Example C are incorporated herein by reference for all purposes.

C.1: Metal Gettering by Metal-Silicon Eutectics/Liquids

This Example C discusses self-assembled internal gettering in silicon. It is believed that the metal alloy clusters responsible for internal gettering are similar in composition to eutectics but the precise composition is undetermined and unlikely to be precisely the eutectic composition. For economy of language in this Example C we use "eutectic/liquid" to indicate that the cluster responsible for gettering by enhanced segregation typically has a melting point below that of the host silicon and may (but is not required) to have a composition similar to that of the eutectic.

C.1.1: External Transition Metal Gettering by a Metal-Silicon Surface Eutectic

Since the 1960s, it has been known that dissolved transition metals in silicon can be gettered by metal-silicon surface layers. Goetzberger and Shockley Ref. c-1 reported transition metal gettering by zinc-silicon and nickel-silicon liquid surface layers. Numerous subsequent studies confirmed these findings for other dissolved transition metal species and surface metal-silicon eutectics/liquids Ref. c-2, c-3, c-4, c-5. The driving force for this gettering mechanism is the higher solubility of metal atoms in a liquid than in crystalline silicon. This is an equilibrium segregation process that can be described by the segregation coefficient ($k_{gett}$), which is defined as the ratio of metal concentrations in the gettering layer ($c_{gett}$) and bulk ($c_{bulk}$) in thermodynamic equilibrium:

$$k_{gett} \equiv \frac{c_{gett}}{c_{bulk}} \quad \text{[Eq. c-1]}$$

The fraction of metals remaining in the bulk after a gettering process that has reached thermodynamic equilibrium is $$\frac{c_{bulk}^{(after)}}{c_{bulk}^{(before)}} = \frac{c_{bulk}^{(after)}}{\left(\frac{c_{bulk}^{(after)} \cdot V_{bulk} + c_{gett}^{(after)} \cdot V_{gett}}{V_{bulk}}\right)} \quad \text{[Eq. c-2]}$$

$$= \frac{1}{1 + \frac{k_{gett} \cdot V_{gett}}{V_{bulk}}},$$

which is ultimately a function of the bulk volume ($V_{bulk}$) and gettering layer volume ($V_{gett}$). For instance, with $k_{gett}$ about $10^6$ and a volume ratio $V_{gett}/V_{bulk}$ about $10^{-4}$, one can expect a hundredfold reduction of dissolved impurities in the bulk.

Note that this type of reaction is generally reversible, as k varies with temperature [ref. c-6, c-7]. One example of metal eutectic/liquid gettering is so-called "aluminum gettering" (an example of "external gettering"), commonly employed in multicrystalline silicon solar cell device fabrication to create a back surface contact and electric field, while gettering transition metal impurities [ref. c-8].

C.1.2: Internal Transition Metal Gettering by Metal-Silicon Eutectics

We are aware of only one report of internal transition metal gettering to metal-silicon eutectic/liquid precipitates in the literature: In float zone silicon, Petersen and Myers observed that Al—Si precipitates (formed by ion implantation of Al and subsequent annealing) successfully getter copper [c-9]. Herein, we formulate a model for self-assembled internal eutectic/liquid gettering clusters, and provide experimental evidence that supports this unique pathway for metal precipitation in silicon.

The most straightforward means of achieving the in-situ formation of liquid droplets inside crystalline silicon is to satisfy the following criteria:

(1) The metal gettering agent M should be precipitated in liquid droplets, not dissolved homogeneously as point defects. In an equilibrium situation, this suggests that M must be supersaturated, i.e., $T_{gett}$ must be less than $T_{Sol}(M)$, the temperature at which the solubility of M equals its bulk concentration. Certainly, non-equilibrium phenomena could also account for liquid M-Si precipitates at [M]<Sol(M) (and these may in fact be the more interesting for implementation, as they can still be effective lower [M]), but for the purpose of simplicity, we will consider the equilibrium case.

(2) The gettering temperature, $T_{gett}$ should be above the M-Si eutectic temperature, $T_{eut}$.

These two conditions restrict $T_{gett}$ to within the following range:

$$T_{eut} < T_{gett} < T_{Sol(M)}. \quad \text{[Eq. c-3]}$$

In other words, the gettering temperature should be above the metal-silicon eutectic/liquid temperature, yet below the temperature at which the metal is completely dissolved in the bulk.

One can illustrate the formation of internal liquid M-Si droplets using a hypothetical M-Si phase diagram (FIG. c-1a). Note that the maximum solid solubility of most 3d transition metals in silicon occurs above the eutectic temperature. This phenomenon of retrograde solubility is thoroughly discussed in Ref. c-10. When $T_{gett} < T_{eut}$, precipitation of M as solid $MSi_x$ precipitates is expected (FIG. c-1b). However, as long as Eq. 3 is satisfied, liquid M-Si droplets can form (FIG. c-1c).

To extend the usable temperature range of this technique, it is desirable that the M-Si eutectic temperature, $T_{M-Si}$ eutectic be as low as possible. For this purpose, we must carefully select M. A plot of M-Si eutectics for the 3d transition metals is shown in FIG. c-2. It is observed that the Cu—Si eutectic temperature is approximately 600° C. below the melting temperature of silicon, providing a substantial temperature window for $T_{gett}$.

Equation c-2 is equally applicable to internal gettering by liquid M-Si droplets. For this to be effective, both $k_{gett}$ (Eq. c-1) and $V_{gett}/V_{bulk}$ are required to be sufficiently large. To first order, the segregation coefficient $k_{gett}$ can be approximated by the ratio of the impurity solubility in crystalline silicon and a liquid phase. For instance, at 800° C., the solubility of Fe in Si is $2.8 \times 10^{12}$ cm$^{-3}$ c-10, c-11], and the solubility of Fe in liquid Si—Cu can be assumed to be at least 0.01%-1%. The equilibrium segregation coefficient $k_{gett}$ is thus estimated to be on the order of $10^6$-$10^8$.

The volume fraction $V_{gett}/V_{bulk}$ is also favorable in the case of Cu, which has a very high solid solubility in silicon (above $10^{18}$ cm$^{-3}$, Ref. c-10). The volume fraction of liquid Cu—Si droplets to bulk silicon ($V_{gett}/V_{bulk}$) can be as large as about $10^{-4}$, provided sufficiently high bulk copper concentration exists.

With these volume concentrations and segregation coefficients, internal gettering by M-Si liquid eutectic droplets can have a significant effect. Using Eq. c-2 and the assumptions above, a theoretical treatment of internal Fe gettering by Cu—Si liquid droplets can be developed, as shown in FIG. c-3. It is seen that the gettering efficiency is strongly a function of $T_{gett}$, and less dependent on the volume fraction $V_{gett}/V_{bulk}$. This model assumes thermodynamic equilibrium and impurity redistribution, a reasonable first-order approximation on the time scale of a cooling mc-Si ingot, which can last several tens of hours.

C.2: Evidence for Self-Assembled Metal-Silicon Eutectic/Liquid Gettering Clusters In mc-Si, one frequently observes multiple metal species precipitated at the same location, as shown in FIG. c-4a. Quantification of this co-precipitation phenomenon reveals a good correlation between the concentrations of different metal species, as shown in FIG. c-4b. Two non-exclusive explanations are possible for this observed effect: (a) the precipitation behavior of one metal species is influenced by the presence of other species, or (b) all metals precipitate preferentially at the most energetically-favorable heterogeneous nucleation sites (hence, metal precipitation is not necessarily affected by other metal species).

To test whether (a) is a significant effect, or whether our observations can be explained by (b) alone, an experiment was performed wherein seven SiGe/Si misfit dislocation structures, with virtually identical structural defect types and concentrations, were intentionally contaminated with Cu, Ni, Fe, Cu+Ni, Cu+Fe, Ni+Fe, and Cu+Ni+Fe at 1100° C., and then slowly cooled to room temperature using substantially identical cooling profiles. The densities and chemical states of precipitated metals were analyzed using µ-XRF (micro X-Ray Fluorescence) and µ-XAS (micro X-Ray Absorption Spectroscopy), respectively.

It was found that the addition of copper greatly enhances the precipitation of nickel and iron, as shown in FIG. c-5. Our earlier hypothesis is thereby validated, that certain metal species can indeed influence the precipitation behavior of others. Again, there exist two possible non-exclusive explanations for the observed results: (a) upon satisfying Eq. c-3 (during cooling), copper forms liquid Cu—Si droplets, which getter other metal species such as Ni and Fe, and (b) Cu$_3$Si formation emits large quantities of silicon self interstitials, which compensate for vacancy-emitting NiSi$_2$ and FeSi$_2$ precipitates.

To determine if (a) is a significant pathway for metal precipitation, the chemical states of precipitates were measured using µ-XAS. In several multiple-metal precipitates, µ-XAS measurements reveal an absorption spectrum (FIG. c-6) most similar to a phase identified by Heuer (Ref. c-12 and Example A herein), consisting of an NiSi$_2$ structure, with Fe substituting on a fraction of Ni sites, and Cu substituting on a fraction of Si sites. The presence of multiple metallic species in a mixed-metal-silicide alloy is indicative of a liquid origin.

Further evidence of liquid mixed-metal silicide droplet formation is a phase separation phenomenon observed in high-resolution µ-XRF and µ-XAS maps of mixed-metal-silicide precipitates. In FIG. c-7a, a cluster of mixed-metal silicide precipitates in a mc-FZ sample is shown. It is clear that each precipitate contains two parts: a Fe+Ni+Cu-rich core, and a Cu-rich nodule. The chemical state of the multiple-metal rich core is determined by µ-XANES (micro X-Ray Absorption Near Edge Structure) to be that of a mixed-metal-silicide (Fe$_x$Ni$_{1-x}$Cu$_y$Si$_{2-y}$) species, rich in Ni and Si. On the other hand, µ-XANES measurements indicate the Cu-rich nodule is composed of a Cu$_3$Si-like compound.

This observation can be described by phase separation that occurs during cooling from higher temperatures, as elements dissolved in the liquid droplet supersaturate and precipitate. As the composition of the liquid droplet follows the liquidus of the quaternary Ni—Si—Cu—Fe phase diagram towards a Cu- and Si-rich eutectic, precipitation of a secondary alloy phase (Fe$_x$Ni$_{1-x}$Cu$_y$Si$_{2-y}$) occurs. The residual Cu- and Si-rich droplet, which may also contain traces of Ni and Fe, is likely the latest to solidify, as evidenced by the low Cu—Si eutectic temperature (FIG. c-2).

Evidence for this phase separation phenomenon is also seen in slowly-cooled ingot mc-Si, as shown in FIG. c-8. Nanometer-scale Cu$_3$Si nodules are attached to Ni+Cu+Fe+Si-rich precipitates in the bottom regions of a cast mc-Si ingot, providing evidence that liquid silicon droplet formation is possible to achieve in commercial solar cell material.

Conversely, these mixed-metal silicide precipitates are not observed in samples which do not satisfy Eq. c-3. A high-resolution µ-XRF map of a Cu and Ni co-contaminated sample annealed at 655° C. (FIG. c-9) does not show a precise juxtaposition of Cu and Ni distributions as in FIGS. c-7 or c-8, and µ-XANES data indicate pure Cu$_3$Si and NiSi$_2$ precipitates have formed.

C.3: Discussion

The "liquid droplet" formation mechanism for metal silicide precipitates generates numerous potential applications, including the sequestration of dangerous metal point defect species during crystal growth. For instance, this phenomenon could be harnessed to concentrate impurities in mc-Si ingots grown of "dirty silicon": since dissolved but supersaturated metal impurities cannot out-diffuse to the ingot surfaces during cooling to room temperature, they could be strongly concentrated at select precipitates within the material at internal liquid gettering droplets. This may be especially useful for the case of iron, since recent results by Macdonald et al ref. c-14 indicate a rather large precipitation barrier for this element between 650 and 900° C., and M-Si eutectic temperatures may be 800° C. (Cu—Si) or lower (as can be expected from Cu-rich mixed-metal silicides). In this case, not only the time-temperature cooling profile is essential, but also the proper ratio of metal impurities, since a metal-silicon liquid droplet supersaturated with iron can no longer getter additional iron atoms, according to Eq. c-2.

C.4: Conclusions

We present a pathway for precipitate formation in Si, involving internal self-assembling internal gettering droplet. This approach offers the possibility of using less pure, less expensive, and more abundant forms of silicon for cost-effective solar cells.

C.5: References

[c-1] A. Goetzberger and W. Shockley, J. Appl. Phys., Vol. 31 (1960) p. 1821.

[c-2] K. P. Abdurakhmanov, K. S. Daliev, G. S. Kulikov, et al, Fizika i Tekhnika Poluprovodnikov, Vol. 27 (1993) p. 1222.

[c-3] N. Gay and S. Martinuzzi, Applied Physics Letters, Vol. 70 (1997) p. 2568.
[c-4] J. Li, W.-S. Yang, T. Y. Tan, et al, in *Proc. Defects in Silicon II* (1991) p. 651.
[c-5] S. Z. Zainabidinov, K. S. Daliev, K. P. Abdurakhmanov, et al, Modern Physics Letters B, Vol. 11 (1997) p. 909.
[c-6] A. Sattler. 2003, Göttingen: Göttingen.
[c-7] A. Sattler, M. Seibt, V. V. Kveder, et al, Solid State Phenomena, Vol. 95-96 (2004) p. 553.
[c-8] M. Seibt, A. Sattler, C. Rudolf, et al, Physica Status Solidi A, Vol. 203 (2006) p. 696.
[c-9] G. A. Petersen and S. M. Myers, Journal of Applied Physics, Vol. 89 (2001) p. 4269.
[c-10] E. R. Weber, Appl. Phys. A: Solids Surf., Vol. 30 (1983) p. 1.
[c-11] K. Graff, *Metal impurities in silicon-device fabrication*. 2000, Berlin; New York: Springer.
[c-12] M. Heuer, T. Buonassisi, M. A. Marcus, et al, Submitted to Phys. Rev. B., Vol.
[c-13] A. Groetzberger and W. Shockley, Journal of Applied Physics, Vol. 31 (1960) p. 1821.
[c-14] D. Macdonald, T. Roth, L. J. Geerligs, et al, Solid State Phenomena, Vol. 108-109 (2005) p. 519.

Although various embodiments which incorporate the teachings of the present invention have been shown and described in detail herein, those skilled in the art can readily devise many other varied embodiments that still incorporate these teachings.

TABLE A-1

Table A-1 refined EXAFS parameters and corresponding paths for copper on silicon site in $NiSi_2$, R = 2.0%

| | | |
|---|---|---|
| $E_0$ | 7.0(1.2) | used for all paths |
| $S^2_0$ | 0.763(88) | used for all paths |
| $\delta R_1$ | 0.138(21) | $Cu_0$—$Ni_{1\_1}$—$Cu_0$ |
| $\delta R_2$ | -0.094(30) | $Cu_0$—$Si_{2\_2}$—$Cu_0$ |
| $\delta R_3$ | $(\delta R_1 + \delta R_2)/2$ | $Cu_0$—$Si_{2\_2}$—$Ni_{1\_1}$—$Cu_0$ |
| $\delta R_4$ | 0.047(31) | $Cu_0$—$Si_{2\_3}$—$Cu_0$ |
| $\sigma^2_1$ | 0.007(2) | $Cu_0$—$Ni_{1\_1}$—$Cu_0$ |
| $\sigma^2_2$ | 0.026(6) | $Cu_0$—$Si_{2\_2}$—$Cu_0$ |
| $\sigma^2_3$ | $\sigma^2_2$ | $Cu_0$—$Si_{2\_2}$—$Ni_{1\_1}$—$Cu_0$ |
| $\sigma^2_4$ | 0.021(5) | $Cu_0$—$Si_{2\_3}$—$Cu_0$ |

What is claimed is:

1. A method of producing solid silicon from molten silicon comprising
   (a) providing a melt of molten silicon having dispersed therein at least two different types of transition metal atoms in sufficient quantities so as to form metal alloy clusters upon cooling; and,
   if advantageous for said formation of metal alloy clusters upon cooling, adding to said melt additional quantities of at least one of said at least two different types of transition metal atoms; and,
   (b) cooling said melt until said transition metal atoms coalesce to form a plurality of metal alloy clusters, wherein said metal alloy clusters are capable of gettering one or more impurity species also present in said melt, and to retain atoms of said one or more impurity species in or on said metal alloy clusters; and,
   (c) cooling said melt further until solidification occurs, thereby segregating at least some of said impurity species in said metal alloy clusters.

2. A method as in claim 1 wherein said metal alloy clusters have a melting temperature less than approximately 1,000 deg. C.

3. A method as in claim 1 wherein said metal alloy clusters are liquid at temperatures less than about 1,000 deg. C.

4. A method as in claim 1 wherein said metal alloy clusters are formed by slow cooling from an initial temperature in the range from approximately 400 deg. C. to approximately 1,000 deg. C. wherein said slow cooling is sufficiently slow to promote the formation of said metal alloy clusters.

5. A method as in claim 4 wherein said slow cooling step includes one or more intervals during which said temperature is maintained at a substantially constant intermediate value.

6. A method as in claim 5 wherein said intermediate value is in the range from approximately 200 deg. C. to approximately 900 deg. C.

7. A method as in claim 4 wherein said slow cooling comprises an initial cooling period with a first cooling rate followed by a second cooling period having a cooling rate less than said first cooling rate followed by a third cooling period having a cooling rate less than that of said second cooling period.

8. A method as in claim 1 wherein additional transition metal atoms of Cu, Ni or mixtures thereof are added to said melt.

9. A method as in claim 1 further comprising, immediately following (b):
   (b.1) maintaining the temperature of said melt above the eutectic/melting temperature of said metal alloy clusters, thereby increasing the quantity of said impurity species gettered to said metal alloy clusters.

10. A method as in claim 1 wherein said at least two different types of transition metal atoms are Cu and Ni.

11. A method as in claim 10 wherein said one or more impurity species includes Fe.

12. A method as in claim 10 wherein said Cu and Ni are present in concentrations above about $10^{13}$ atoms per $cm^3$.

13. A method of producing solid semiconducting material from molten semiconducting material comprising:
   (a) providing a melt of molten semiconducting material having dispersed therein at least two different types of transition metal atoms in sufficient quantities so as to form metal alloy clusters upon cooling; and
   if advantageous for said formation of metal alloy clusters upon cooling, adding to said melt additional quantities of at least one of said at least two different types of transition metal atoms; and
   (b) cooling said melt until said transition metal atoms coalesce to form a plurality of metal alloy clusters, wherein said metal alloy clusters are capable of gettering one or more impurity species also present in said melt, and to retain atoms of said one or more impurity species in or on said metal alloy clusters; and
   (c) cooling said melt further until solidification occurs, thereby segregating at least some of said impurity species in said metal alloy clusters.

14. A method as in claim 13 further comprising, immediately following (b):
   (b.1) maintaining the temperature of said melt above the eutectic/melting temperature of said metal alloy clusters, thereby increasing the quantity of said impurity species gettered to said metal alloy clusters.

15. A method for internal gettering of a silicon mixture by forming metal alloy clusters to yield an improved crystalline silicon having enhanced electrical properties, comprising the steps of:
   forming a silicon melt from a silicon feedstock by heating the silicon feedstock above the melting point of said silicon feedstock, said silicon feedstock comprising a pre-existing level of metallic impurities;

purposefully adding to said silicon melt a combination of metals to form a molten silicon mixture, said combination of metals being added for balancing with the material properties of said pre-existing level of metallic impurities and, thereby, facilitating formation of metal alloy clusters, said metal alloy clusters having a generally lower melting point than the melting point of said silicon feedstock;

controllably cooling said molten silicon to form said metal alloy clusters for promoting internal gettering within said silicon mixture, said controllably cooling further comprising the steps of:
(a) forming solidified bulk silicon at a temperature above the generally lower melting point of said metal alloy clusters, and
(b) segregating metal alloy precipitates from said pre-existing level of metallic impurities within said molten silicon mixture to promote local collection of said metal alloy precipitates in isolated locations to thereby yield an improved crystalline silicon having enhanced electrical properties.

16. The method of claim 15 wherein said metal alloy clusters have a melting temperature less than approximately 1,000° C.

17. The method of claim 15 wherein said metal alloy clusters are liquid at temperatures less than about 1,000° C.

18. The method of claim 15 wherein said metal alloy clusters are formed by slow cooling from an initial temperature in the range from approximately 400° C. to approximately 1,000° C., and further wherein said slow cooling is sufficiently slow to promote the formation of said metal alloy clusters.

19. The method of claim 18 wherein said slow cooling step includes one or more intervals during which said temperature is maintained at a substantially constant intermediate value.

20. The method of claim 19 wherein said intermediate value is in the range from approximately 200° C. to approximately 900° C.

21. The method of claim 18 wherein said slow cooling comprises an initial cooling period with a first cooling rate followed by a second cooling period having a cooling rate less than said first cooling rate followed by a third cooling period having a cooling rate less than that of said second cooling period.

22. A method of processing silicon containing impurities by internal gettering comprising adding additional transition metal atoms to molten silicon so as to increase the effectiveness of said internal gettering during cooling of said molten silicon, thereby producing silicon having one or more improved electrical properties than had said additional transition metal atoms not been added, the method comprising the steps of:
forming a silicon melt from a silicon feedstock by heating the silicon feedstock above the melting point of said silicon feedstock, said silicon feedstock comprising a pre-existing level of metallic impurities;
purposefully adding to said silicon melt a combination of transition metal atoms to form a molten silicon mixture, said combination of metals being added for balancing with the material properties of said pre-existing level of metallic impurities and, thereby, facilitating formation of metal alloy clusters, said metal alloy clusters having a generally lower melting point than the melting point of said silicon feedstock;
controllably cooling said molten silicon to form said metal alloy clusters for promoting internal gettering within said silicon mixture, said controllably cooling further comprising the steps of:
(a) forming solidified bulk silicon at a temperature above the generally lower melting point of said metal alloy clusters, and
(b) segregating metal alloy precipitates from said pre-existing level of metallic impurities within said molten silicon mixture to promote local collection of said metal alloy precipitates in isolated locations to thereby yield an improved crystalline silicon having enhanced electrical properties.

23. The method of claim 22 wherein said additional transition metal atoms are Cu, Ni or mixtures thereof.

24. A method of processing a semiconducting material for internal gettering of metal impurities within said semiconducting material by metal alloy clusters, comprising the steps of:
forming a semiconducting material melt from a semiconducting material feedstock by heating the semiconducting material feedstock above the melting point of said semiconducting material feedstock, said semiconducting material feedstock comprising a pre-existing level of metallic impurities;
purposefully adding to said semiconducting material melt a combination of transition metal atoms to form a molten semiconducting material mixture, said combination of metals being added for balancing with the material properties of said preexisting level of metallic impurities and, thereby, facilitating formation of metal alloy clusters, said metal alloy clusters having a generally lower melting point than the melting point of said semiconducting material feedstock;
controllably cooling said molten semiconducting material to form said metal alloy clusters for promoting internal gettering within said semiconducting material mixture, said controllably cooling further comprising the steps of:
(a) forming solidified bulk semiconducting material at a temperature above the generally lower melting point of said metal alloy clusters, and
(b) segregating metal alloy precipitates from said pre-existing level of metallic impurities within said molten silicon mixture to promote local collection of said metal alloy precipitates in isolated locations to thereby yield an improved crystalline semiconducting material having enhanced electrical properties.

25. The method of claim 24, further comprising the step of increasing the minority carrier diffusion length within a semiconducting material comprising internal gettering of metal impurities within said semiconducting material by metal alloy clusters wherein said metal alloy clusters have a melting temperature below that of said semiconducting material.

26. The method of claim 24 wherein said metal alloy clusters comprise at least one transition metal.

* * * * *